United States Patent
Wang et al.

(10) Patent No.: US 11,908,524 B2
(45) Date of Patent: Feb. 20, 2024

(54) APPARATUS AND METHODS FOR PROGRAMMING MEMORY CELLS

(71) Applicant: WESTERN DIGITAL TECHNOLOGIES, INC., San Jose, CA (US)

(72) Inventors: Ming Wang, Shanghai (CN); Liang Li, Shanghai (CN); Ke Zhang, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 147 days.

(21) Appl. No.: 17/752,208

(22) Filed: May 24, 2022

(65) Prior Publication Data
US 2023/0410910 A1  Dec. 21, 2023

(51) Int. Cl.
| | | |
|---|---|---|
| *G11C 16/10* | (2006.01) | |
| *G11C 16/04* | (2006.01) | |
| *G11C 16/24* | (2006.01) | |
| *G11C 16/34* | (2006.01) | |
| *H10B 41/27* | (2023.01) | |
| *H10B 43/27* | (2023.01) | |

(52) U.S. Cl.
CPC .......... *G11C 16/10* (2013.01); *G11C 16/0483* (2013.01); *G11C 16/24* (2013.01); *G11C 16/3459* (2013.01); *H10B 41/27* (2023.02); *H10B 43/27* (2023.02)

(58) Field of Classification Search
CPC ..... G11C 16/10; G11C 16/0483; G11C 16/24; G11C 16/3459; H10B 41/27; H10B 43/27
See application file for complete search history.

(56) References Cited

U.S. PATENT DOCUMENTS

| | | | |
|---|---|---|---|
| 7,492,634 B2* | 2/2009 | Li | G11C 16/12 365/185.21 |
| 7,986,560 B2 | 7/2011 | Park et al. | |
| 8,456,915 B2* | 6/2013 | Chen | G10L 15/26 365/185.24 |
| 8,902,668 B1 | 12/2014 | Dutta et al. | |
| 9,230,663 B1* | 1/2016 | Lu | G11C 11/5671 |
| 9,343,141 B2* | 5/2016 | Pang | G11C 11/5628 |
| 9,721,672 B1* | 8/2017 | Dutta | G11C 16/0483 |
| 9,779,790 B2* | 10/2017 | Park | G11C 16/10 |
| 10,643,721 B2* | 5/2020 | Yang | G11C 16/08 |
| 11,568,946 B2* | 1/2023 | Lee | G11C 11/5671 |

* cited by examiner

*Primary Examiner* — Son L Mai
(74) *Attorney, Agent, or Firm* — Vierra Magen Marcus LLP

(57) ABSTRACT

An apparatus is provided that includes a memory die having a first memory cell, and a controller connected to the memory die. The controller is configured to apply a plurality of programming pulses to the first memory cell, apply a plurality of first verify pulses to the first memory cell, determine from the first verify pulses that the first memory cell has been programmed to a first programmed memory state, apply a single second verify pulse to the first memory cell after determining that the first memory cell has been programmed to the first programmed memory state, determine from the single second verify pulse that the first memory cell is no longer programmed to the first programmed memory state, and apply an additional programming pulse to the first memory cell.

20 Claims, 19 Drawing Sheets

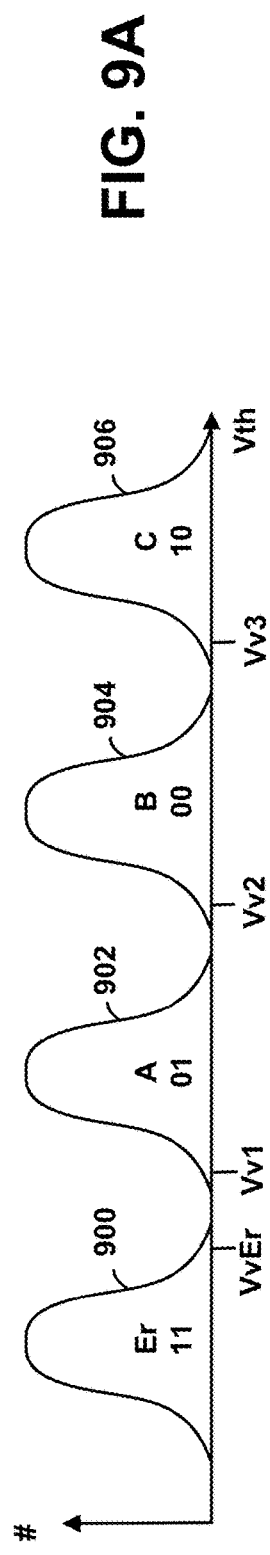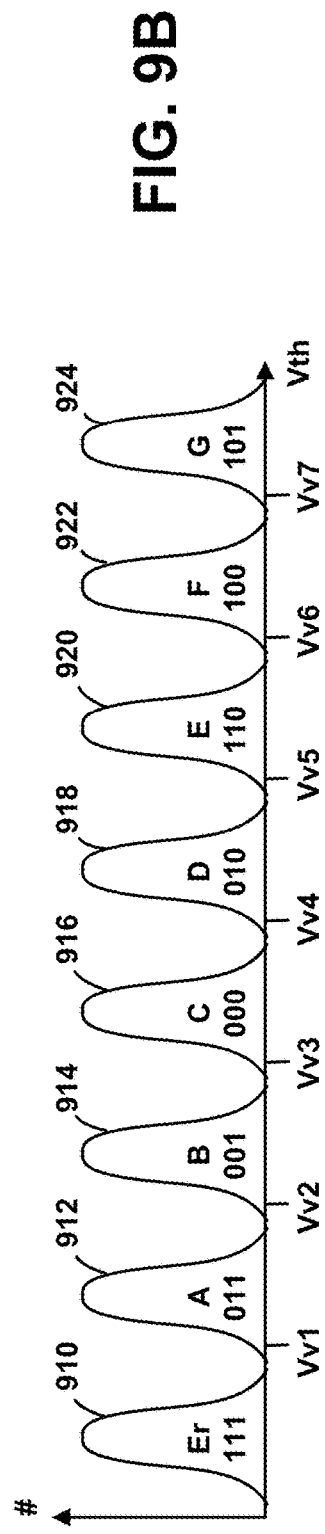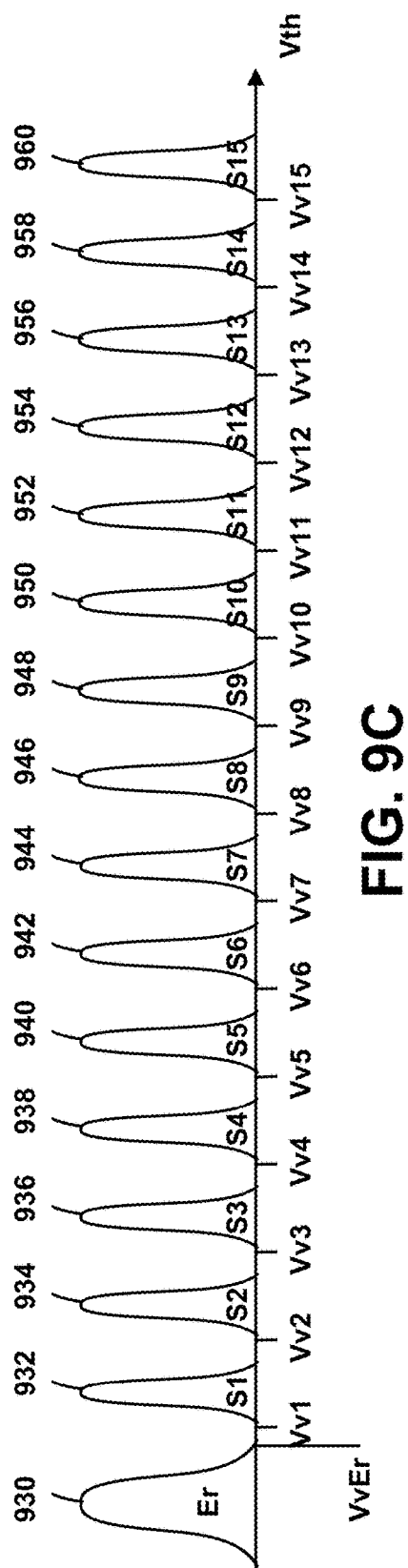

|     | Er | A | B | C | D | E | F | G |
|-----|----|----|----|----|----|----|----|----|
| CDL | 1  | 1 | 1 | 0 | 0 | 0 | 0 | 1 |
| BDL | 1  | 1 | 0 | 0 | 1 | 1 | 0 | 0 |
| ADL | 1  | 0 | 0 | 0 | 0 | 1 | 1 | 1 |
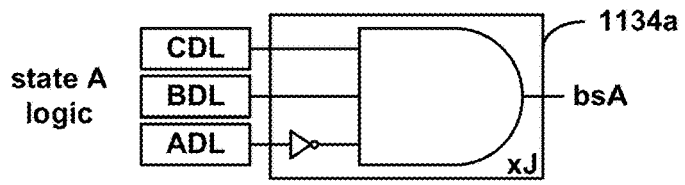
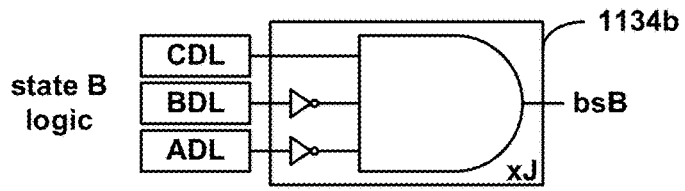
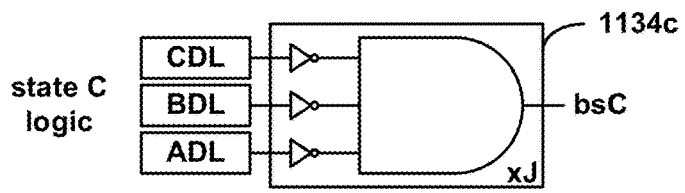
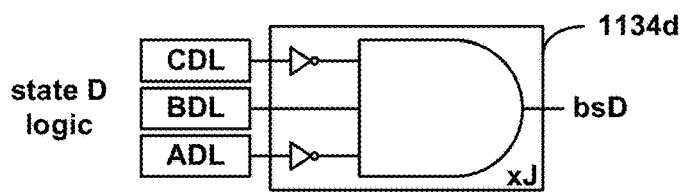
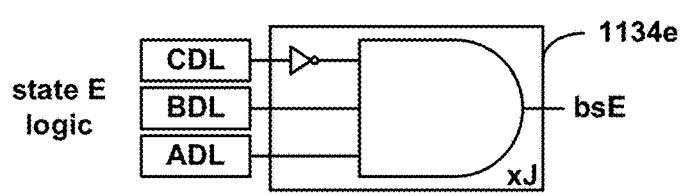
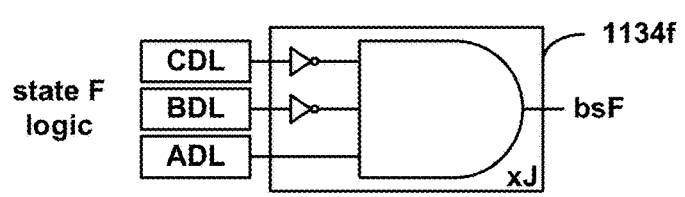
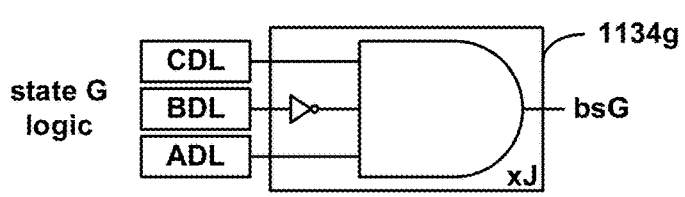
FIG. 11C

|  | Unpassed B | QPW B | Inhibited B |
|---|---|---|---|
| CDL | 1 | 1 | 1 |
| BDL | 0 | 0 | 0 |
| ADL | 0 | 0 | 0 |
| SEN | 0 | 0 | 1 |
| TDL = SEN \| TDL | 0 | 1 | 1 |
| SDL = SEN \| SDL | 0 | 0 | 1 |

APPARATUS AND METHODS FOR PROGRAMMING MEMORY CELLS

BACKGROUND

The present technology relates to memory devices. Semiconductor memory devices have become more popular in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a memory state. A charge-trapping material can be arranged vertically in a three-dimensional stacked memory structure, or horizontally in a two-dimensional memory structure. One example of a three-dimensional memory structure is the Bit Cost Scalable (BiCS) architecture which includes a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 9A depicts an embodiment of threshold voltage distributions for a four-state memory device in which each memory cell stores two bits of data.

FIG. 9B depicts an embodiment of threshold voltage distributions for an eight-state memory device in which each memory cell stores three bits of data.

FIG. 9C depicts an embodiment of threshold voltage distributions for a sixteen-state memory device in which each memory cell stores four bits of data.

FIG. 11C is a diagram of an embodiment of state S1-S7 logic circuits of FIG. 11B.

FIG. 14 is a table depicting example values of data latches associated with a memory cell to be programmed to a particular programmed memory state.

DETAILED DESCRIPTION

Figure 1:
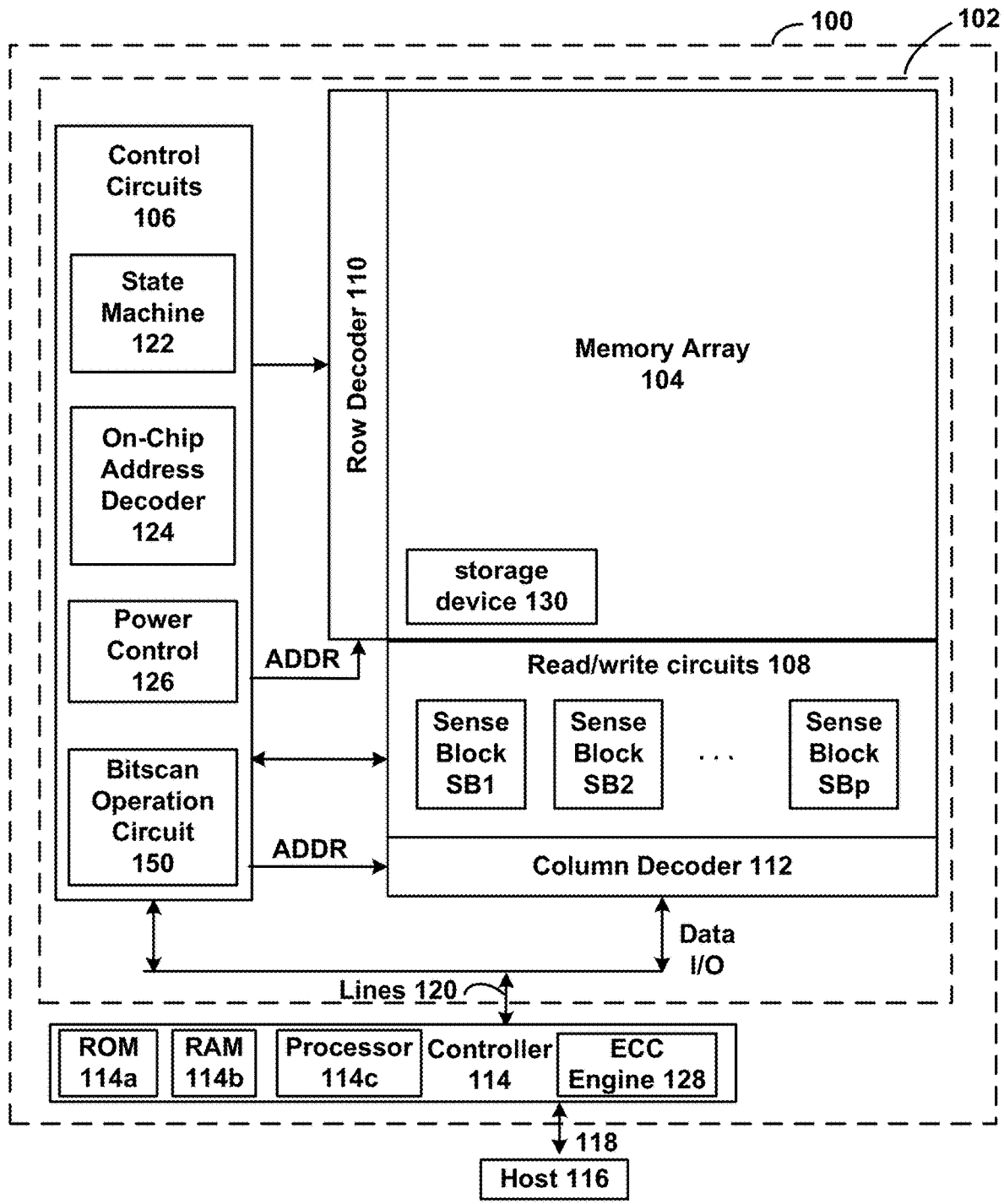
FIG. 1 is a block diagram of an example memory device.

Apparatus and methods are provided for programming a memory device. In particular, apparatus and methods are provided to improve short term data retention of non-volatile memory cells.

A programming operation for a group of memory cells typically involves providing the memory cells in an erased state and then applying a series of program pulses to the memory cells. Each program pulse is provided in a program loop, also referred to as a program-verify iteration. For example, the program pulse may be applied to a word line that is connected to control gates of the memory cells.

In one approach, incremental step pulse programming is performed, in which the program pulse amplitude is increased by a step size in each program loop. Verify operations may be performed after each program pulse to determine whether the memory cells have completed programming. When programming has completed for a memory cell, the memory cell can be locked out from further programming while programming continues for other memory cells in subsequent program loops.

Each memory cell may be associated with a particular memory state according to write data in a program command. As used herein, a "memory state" is a detectable characteristic of a memory cell (e.g., a threshold voltage of a NAND memory cell, a resistance of a ReRAM memory cell, a magnetization state of a magnetoresistive random access memory) that may be used to represent a data value, such as a binary data value. As used herein, the detectable characteristic of a memory cell used to represent a data value is referred to as a "programming characteristic." Based on write data in a program command, a memory cell will either remain in the erased state or be programmed to a memory state (a programmed memory state) different from the erased state.

For example, in a two-bit per cell memory device, there are four memory states including the erased state and three programmed memory states. In a three-bit per cell memory device, there are eight memory states including the erased state and seven programmed memory states. In a four-bit per cell memory device, there are sixteen memory states including the erased state and fifteen programmed memory states.

When a program command is issued, the write data are stored in data latches associated with the memory cells. For example, in a two-bit per cell memory device, each memory cell is associated with two data latches (e.g., ADL, BDL) that store the two-bit write data for the memory cell. Likewise, in a three-bit per cell memory device, each memory cell is associated with three data latches (e.g., ADL, BDL, CDL) that store the three-bit write data for the memory cell. Similarly, in a four-bit per cell memory device, each memory cell is associated with four data latches (e.g., ADL, BDL, CDL, DDL) that store the four-bit write data for the memory cell.

During programming, the data latches of a memory cell can be read to determine the particular memory state to which the cell is to be programmed. For NAND memory cells, each programmed memory state is associated with a verify voltage. A NAND memory cell with a particular memory state is considered to have completed programming when a sensing operation determines the threshold voltage (Vth) of the memory cell is above the associated verify voltage. In other words, the NAND memory cell has completed programming to the particular memory state.

A sensing operation can determine whether a memory cell has a threshold voltage Vth above the associated verify voltage by applying the associated verify voltage to the control gate and sensing a current through the memory cell. If the current is relatively high, this indicates the memory cell is in a conductive state and the threshold voltage Vth is less than the control gate voltage. If the current is relatively low, this indicates the memory cell is in a non-conductive state and the threshold voltage Vth is above the control gate voltage.

In addition to the verify operations described above, a bitscan operation also may be performed to determine when programming is complete for a group of memory cells. As used herein, a "bitscan" is an operation that counts a number of memory cells whose programming characteristic has not shifted above a particular verify voltage level for a particular memory state. For NAND memory cells, a bitscan is an operation that counts a number of memory cells whose threshold voltage Vth has not shifted above a particular verify voltage level for a particular memory state.

For example, a state N bitscan is a count of a number of state N memory cells whose threshold voltage Vth has not shifted above a verify voltage level for state N. Likewise, a state (N+1) bitscan is a count of a number of state (N+1) memory cells whose threshold voltage Vth has not shifted above a verify voltage level for state (N+1), and so on. For simplicity, the following discussion will refer to bitscan operations for NAND memory cells. Persons of ordinary skill in the art will understand that bitscan operations also may be used for other non-volatile memory technologies.

Programming of memory cells to a particular memory state may be considered complete if the bitscan count for a particular state is less than a predetermined value. In some embodiments, the predetermined value is less than a number of read errors that can be corrected by an error correction code engine. In other words, programming of memory cells to a particular memory state may be considered complete even though all memory cells that are to be programmed to the particular memory state do not have threshold voltages Vth that have shifted above a verify voltage level for the memory state, as long as the number of "failing" memory cells is less than a number of read errors that can be corrected by an error correction code engine.

Bitscan calculations typically are performed based on results of verify operations for a particular program-verify iteration. In particular, following application of a program pulse, verify operations may be performed for one or more memory states, and then results of the verify operations may be used to calculate the bitscan for a particular memory state.

As described above, a NAND memory cell with a particular memory state is considered to have completed programming when a sensing operation determines the threshold voltage Vth of the memory cell is above the associated verify voltage. In some instances, after programming a NAND memory cell completes, the threshold voltage Vth of the memory cell may shift below the associated verify voltage. Such threshold voltage drift is commonly referred to as short term data retention. Short term data retention is a common reliability issue for memory devices, such as charge trap memory, and usually is caused by the insecure charge loss (electrons or holes) from some traps with shallow energy levels. For nonvolatile memory, the higher the state the worse the short term data retention.

Technology is described for improving short term data retention. In embodiments, after memory cells for a particular programmed memory state (e.g., programmed memory state X) have passed verify (e.g., in program loop N), all state X memory cells have threshold voltages above the state X verify level. In embodiments, state X memory cells are re-verified in program loop N+i, i≥1, to identify any state X memory cells whose threshold voltage shifted below the state X verify level.

In embodiments, the identified memory cells are re-programmed in program loop N+i+j, j≥1, to shift the threshold voltages of the identified memory cells back above the state X verify level. In embodiments, to avoid over-programming during the re-programming operation, the bit lines coupled to identified memory cells are biased to a voltage (e.g., a quick pass write voltage) higher than the bias used during normal programming. Without wanting to be bound by any particular theory, it is believed that re-verifying the memory cells after programming has completed, and then re-programming identified memory cells whose threshold voltage shifted below the state X verify level may improve short term data retention of such memory cells.

FIG. 1 is a block diagram of an example memory device 100. Memory device 100 may include one or more memory die 102. Memory die 102 includes a memory array 104 of memory cells, control circuits 106, and read/write circuits 108. Memory array 104 is addressable by word lines via a row decoder 110 and by bit lines via a column decoder 112. Read/write circuits 108 include multiple sense blocks SB1, SB2, ..., SBp and allow a page of memory cells to be read or programmed in parallel. Memory device 100 also may include a controller 114. Commands and data are transferred between a host 116 and controller 114 via a data bus 118, and between controller 114 and the one or more memory die 102 via lines 120.

Memory array 104 can be two-dimensional or three-dimensional. Memory array 104 may include one or more arrays of memory cells. Memory array 104 may include a monolithic three dimensional memory structure in which multiple memory levels are formed above (and not in) a single substrate, such as a wafer, with no intervening substrates. Memory array 104 may include any type of non-volatile memory that is monolithically formed in one or more physical levels of arrays of memory cells having an active area disposed above a silicon substrate. Memory array 104 may be a non-volatile memory device having circuitry associated with the operation of the memory cells, whether the associated circuitry is above or within the substrate.

Control circuits 106 cooperate with read/write circuits 108 to perform memory operations on memory array 104, and includes a state machine 122, an on-chip address decoder 124, and a power control module 126. State machine 122 provides chip-level control of memory operations. On-chip address decoder 124 provides an address interface between addresses used by a host or a memory controller to the hardware address used by row decoder 110 and column decoder 112. Power control module 126 controls the power and voltages supplied to the word lines and bit lines during memory operations, and can include drivers for word lines, SGS and SGD transistors and source lines. Sense blocks SB1, SB2, . . . , SBp can include bit line drivers, in one approach.

In embodiments, some of the components can be combined. In various designs, one or more of the components (alone or in combination), other than memory array 104, can function as a control circuit that is configured to perform the actions described herein. For example, a control circuit may include one or more of control circuits 106, read/write circuits 108, row decoder 110, column decoder 112, controller 114, state machine 122, power control module 126, bitscan operation circuit 150 and sense blocks SBb, SB2, . . . , SBp.

The control circuits can include a programming circuit configured to perform a programming operation for memory cells. The programming operation includes a plurality of program-verify iterations, and in each program-verify iteration the programming circuit applies one or more programming pulses to the memory cells.

Controller 114 may include storage devices (memory) such as ROM 114a and RAM 114b, a processor 114c, and an error-correction code (ECC) engine 128 that can correct a number of read errors. In an embodiment, a storage device that includes code such as a set of instructions, and processor 114c is operable to execute the set of instructions to provide the functionality described herein. Alternatively or additionally, processor 114c can access code from a storage device 130 of memory array 104, such as a reserved area of memory cells in one or more word lines.

For example, code can be used by controller 114 to access memory array 104 such as for programming, read and erase operations. The code can include boot code and control code (e.g., a set of instructions). The boot code is software that initializes the controller during a booting or startup process and enables controller 114 to access memory array 104. The code can be used by controller 114 to control one or more memory structures.

Upon being powered up, processor 114c fetches the boot code from ROM 114a or storage device 130 for execution, and the boot code initializes the system components and loads the control code into RAM 114b. Once loaded into RAM 114b, the control code is executed by processor 114c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In an embodiment, host 116 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host also may include additional system memory, one or more input/output interfaces and/or one or more input/output devices in communication with the one or more processors.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration. Other types of non-volatile memory in addition to NAND flash memory also can be used.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

The exact type of memory cells in memory array 104 is not limited to the examples above. Many different types of memory array architectures or memory technologies can be used to form memory array 104. No particular non-volatile memory technology is required for purposes of the new claimed embodiments proposed herein. Other examples of suitable technologies for memory cells of memory array 104 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory array 104 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte.

In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage, light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors including memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array also may have one or more memory layers at least partially within the single substrate. As a non-limiting example, the substrate may include a semiconductor such as silicon. In a monolithic three dimensional memory array, the layers constituting each memory device level of the array are typically formed on the layers of the underlying memory device levels of the array. However, layers of adjacent memory device levels of a monolithic three dimensional memory array may be shared or have intervening layers between memory device levels.

In addition, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry typically is required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
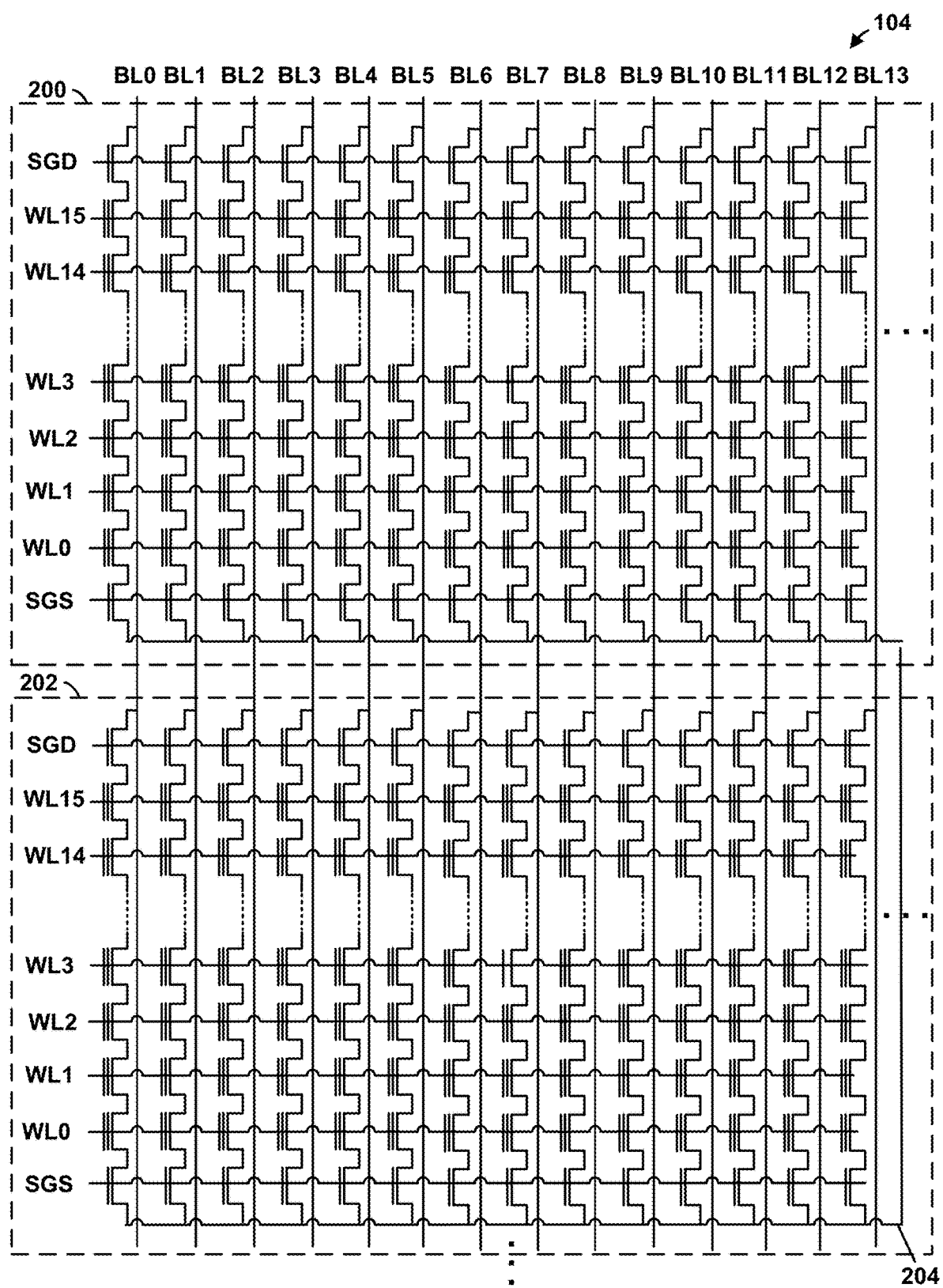
FIG. 2 depicts blocks of memory cells in an example two-dimensional configuration of the memory array of FIG. 1.

FIG. 2 depicts blocks of memory cells in an example two-dimensional configuration of memory array 104 of FIG. 1. Memory array 104 can include many blocks. Each example blocks 200 and 202 include a number of NAND strings and respective bit lines, e.g., BL0, BL1, . . . which are shared among the blocks. Each NAND string is connected at one end to a drain select gate (SGD) transistor, and are connected at their other end to a source select gate (SGS) transistor which, in turn, is connected to a common source line 204.

Control gates of the SGD transistors are connected via a common SGD line, and control gates of the SGS transistors are connected via a common SGS line. Sixteen word lines, for example, WL0-WL15, extend between the SGD transistors and the SGS transistors. In some cases, dummy word lines, which contain no user data, also can be used in the memory array adjacent to the SGD/SGS transistors. Such dummy word lines can shield the edge data word line from certain edge effects.

Figure 3A:
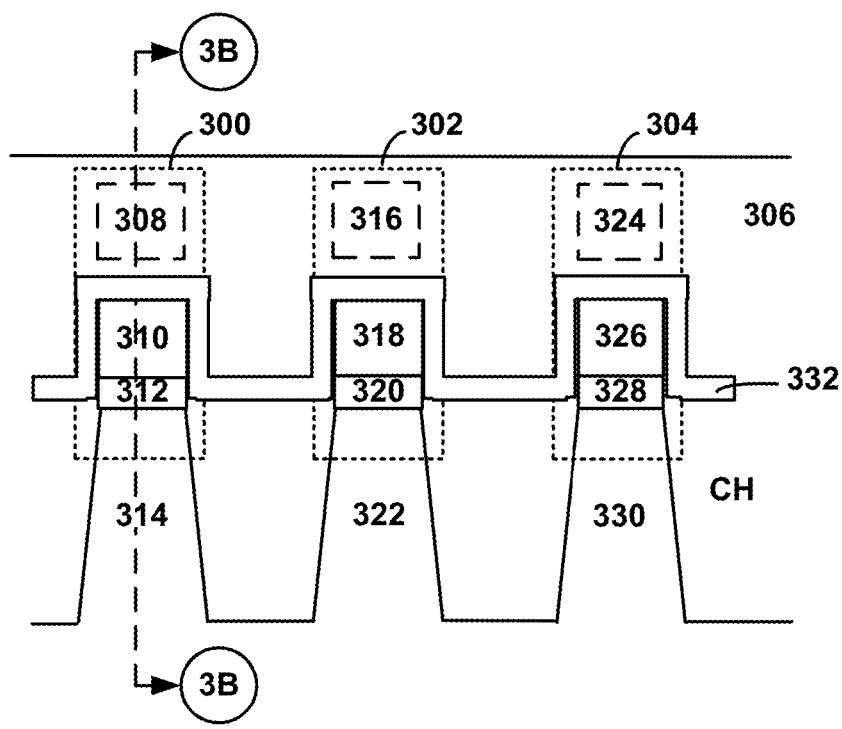
FIGS. 3A-3B depict cross-sectional views of example floating gate memory cells in NAND strings.
Figure 3B:
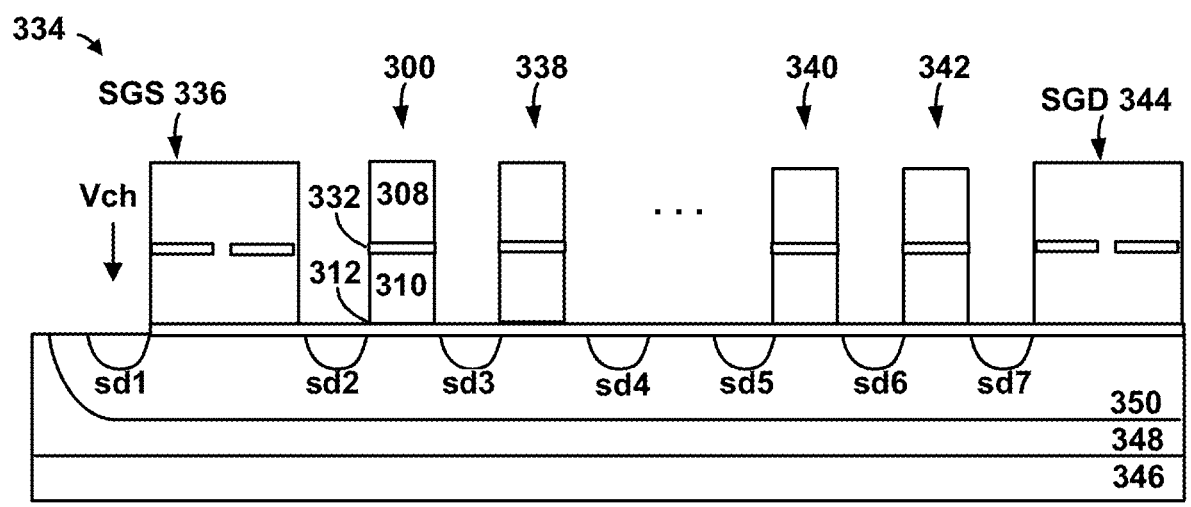

A floating gate memory is one type of non-volatile memory which may be provided in memory array 104. FIGS. 3A-3B depict cross-sectional views of example floating gate memory cells (e.g., in memory array 104 of FIG. 1) in NAND strings. In FIG. 3A, a bit line or NAND string direction goes into the page, and a word line direction goes from left to right. FIG. 3A depicts memory cells 300, 302 and 304, each coupled to a word line 306.

Memory cell 300 includes a control gate 308, a floating gate 310, a tunnel oxide layer 312 and a channel region 314. Memory cell 302 includes a control gate 316, a floating gate 318, a tunnel oxide layer 320 and a channel region 322. Memory cell 304 includes a control gate 324, a floating gate 326, a tunnel oxide layer 328 and a channel region 330. Each of memory cells 300, 320 and 304 is in a different respective NAND string. An inter-poly dielectric (IPD) layer 332 also is depicted. Control gates 308, 316 and 324 are portions of word line 306.

Referring to FIG. 3B, a NAND string 334 includes an SGS transistor 336, example memory cells 300, 338, . . . , 340 and 342, and an SGD transistor 344. Memory cell 300 includes control gate 308, IPD layer 332, floating gate 310 and tunnel oxide layer 312. Passageways in IPD layer 332 in the SGS and SGD transistors allow the control gate layers and floating gate layers to communicate. In an embodiment, the control gate and floating gate layers may be polysilicon and the tunnel oxide layer may be silicon oxide. IPD layer 332 can be a stack of nitrides (N) and oxides (O) such as in a N—O—N—O—N configuration.

NAND string 334 may be formed on a substrate which includes a p-type substrate region 346, an n-type well 348 and a p-type well 350. N-type source/drain diffusion regions sd1, sd2, sd3, sd4, sd5, sd6 and sd7 are formed in p-type well 350. A channel voltage, Vch, may be applied directly to the channel region of the substrate.

Figure 4A:
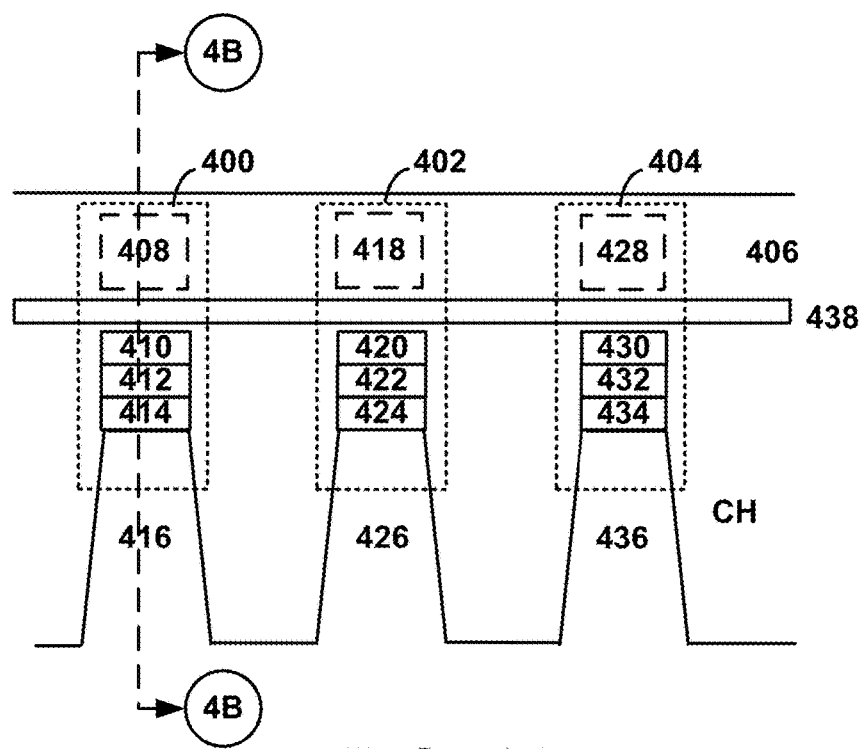
FIGS. 4A-4B depict cross-sectional views of example charge-trapping memory cells in NAND strings.
Figure 4B:
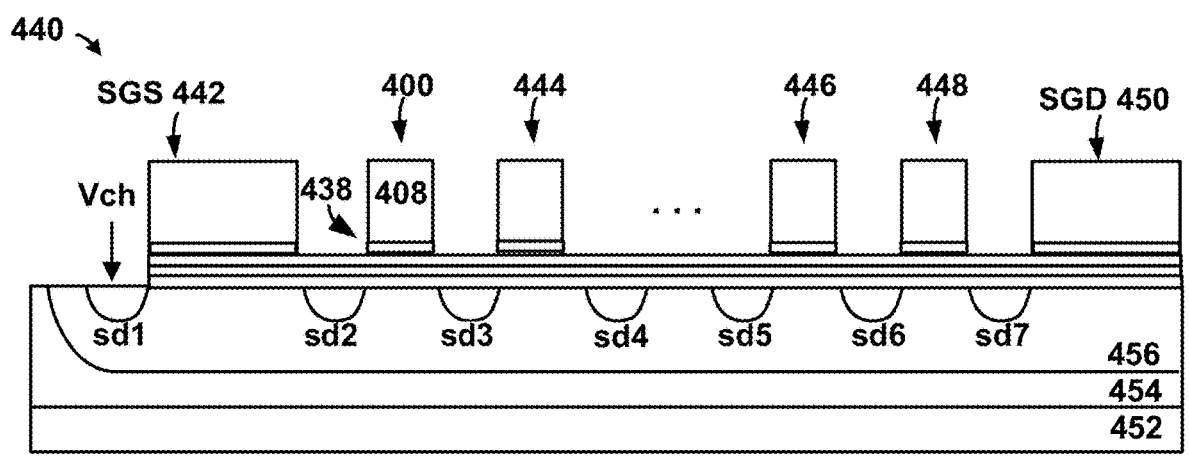

Another type of non-volatile memory is a charge-trapping memory cell that uses a non-conductive dielectric material to store charge. FIGS. 4A-4B depict cross-sectional views of example charge-trapping memory cells (e.g., in memory array 104 of FIG. 1) in NAND strings. In FIG. 4A, the view is in a word line direction. Charge-trapping memory technology uses an insulator such as an SiN film to store electrons, in contrast to a floating-gate MOSFET technology which uses a conductor such as doped polycrystalline silicon to store electrons.

FIG. 4A depicts memory cells 400, 402 and 404, each coupled to a word line 406. Memory cell 400 includes a control gate 408, a charge-trapping layer 410, a polysilicon layer 412, a tunneling layer 414 and a portion of a channel region 416. Memory cell 402 includes a control gate 418, a charge-trapping layer 420, a polysilicon layer 422, a tunneling layer 424 and a portion of a channel region 426. Memory cell 404 includes a control gate 428, a charge-trapping layer 430, a polysilicon layer 432, a tunneling layer 434 and a portion of the channel region 436.

As an example, word line 406 extends across NAND strings which include respective channel regions 416, 426 and 436. Portions of word line 406 provide control gates 408, 418 and 428. Below word line 406 is an IPD layer 438, charge-trapping layers 410, 420 and 430, polysilicon layers 412, 422 and 432 and tunneling layer layers 414, 424 and 434. Each of charge-trapping layers 410, 420 and 430 extends continuously in a respective NAND string.

Referring to FIG. 4B, a NAND string 440 includes an SGS transistor 442, memory cells 400, 444, . . . , 446 and 448, and an SGD transistor 450. NAND string 440 may be formed on a substrate which includes a p-type substrate region 452, an n-type well 454 and a p-type well 456. N-type source/drain diffusion regions sd1, sd2, sd3, sd4, sd5, sd6 and sd7 are formed in the p-type well 456. A channel voltage, Vch, may be applied directly to the channel region of the substrate. Memory cell 400 includes control gate 408 and the IPD layer 438 above charge-trapping layer 410, polysilicon layer 412, tunneling layer 414 and a channel region 416.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

In this example, the layers 410, 412 and 414 extend continuously in the NAND string. In another approach, portions of the layers 410, 412 and 414 which are between the control gates 408, 418 and 428 can be removed, exposing a top surface of the channel 416.

Figure 5:
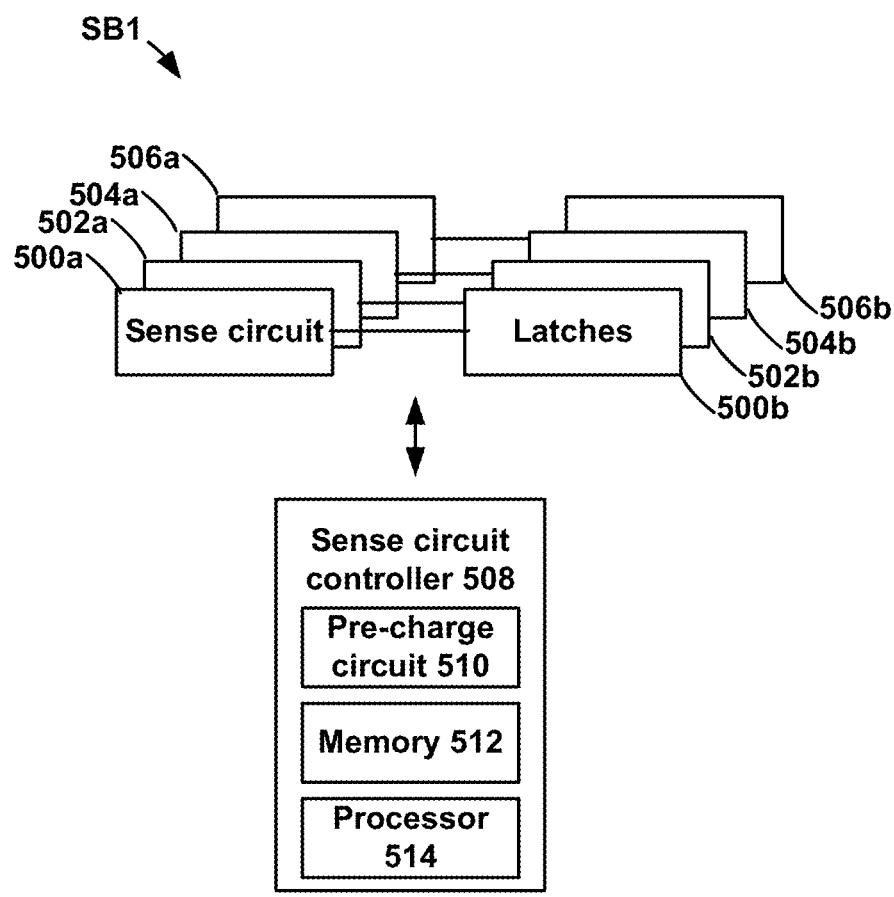
FIG. 5 depicts an example block diagram of the sense block SB1 of FIG. 1.

FIG. 5 depicts an example block diagram of the sense block SB1 of FIG. 1. Sense block includes multiple sense circuits 500a, 502a, 504a and 506a, associated with data latches 500b, 502b, 504b and 506b, respectively. Sense block SB1 also includes a sense circuit controller 508 which can communicate with sense circuits 500a, 502a, 504a and 506a and data latches 500b, 502b, 504b and 506b.

In an embodiment, sense circuit controller 508 includes a pre-charge circuit 510, a memory 512 and a processor 514. Pre-charge circuit 510 provides a voltage to each of sense circuits 500a, 502a, 504a and 506a for setting a pre-charge voltage. Memory 512 may store code which is executable by processor 514 to perform the functions described herein. These functions can include reading data latches 500b, 502b, 504b and 506b, setting bit values in data latches 500b, 502b, 504b and 506b and providing voltages for setting pre-charge levels in sense nodes of sense circuits 500a, 502a, 504a and 506a.

Figure 6A:
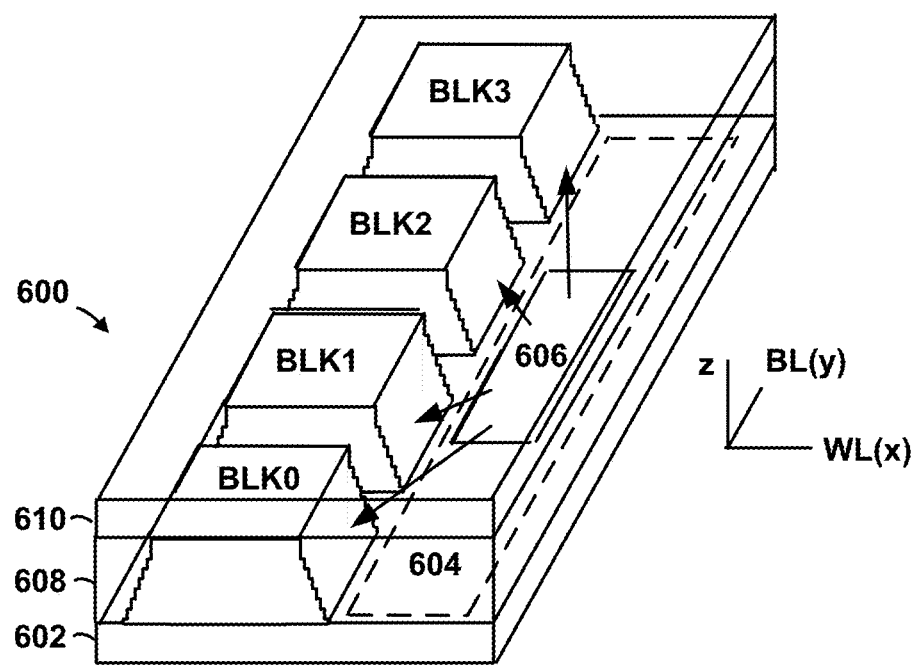
FIG. 6A is a perspective view of a set of blocks in an example three-dimensional configuration of the memory array of FIG. 1.

FIG. 6A is a perspective view of a set of blocks 600 in an example three-dimensional configuration of memory array 104 of FIG. 1. On a substrate 602 are example blocks BLK0, BLK1, BLK2 and BLK3 of memory cells and a peripheral area 604 with circuitry for use by blocks BLK0, BLK1, BLK2 and BLK3. For example, the circuitry can include voltage drivers 606 which can be connected to control gate layers of blocks BLK0, BLK1, BLK2 and BLK3. Substrate 602 also can include circuitry under blocks BLK0, BLK1, BLK2 and BLK3, and one or more lower metal layers which are patterned in conductive paths to carry signals of the circuitry.

In an embodiment, blocks BLK0, BLK1, BLK2 and BLK3 are formed in an intermediate region 608 of the memory device. In an upper region 610 of the memory device, one or more upper metal layers are patterned in conductive paths to carry signals of the circuitry. Each of blocks BLK0, BLK1, BLK2 and BLK3 includes a stacked area of memory cells, where alternating levels of the stack represent word lines. In an embodiment, each of blocks BLK0, BLK1, BLK2 and BLK3 has opposing tiered sides from which vertical contacts extend upward to an upper metal layer to form connections to conductive paths. Although four blocks BLK0, BLK1, BLK2 and BLK3 are depicted as an example, two or more blocks can be used, extending in the x- and/or y-directions.

In an embodiment, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
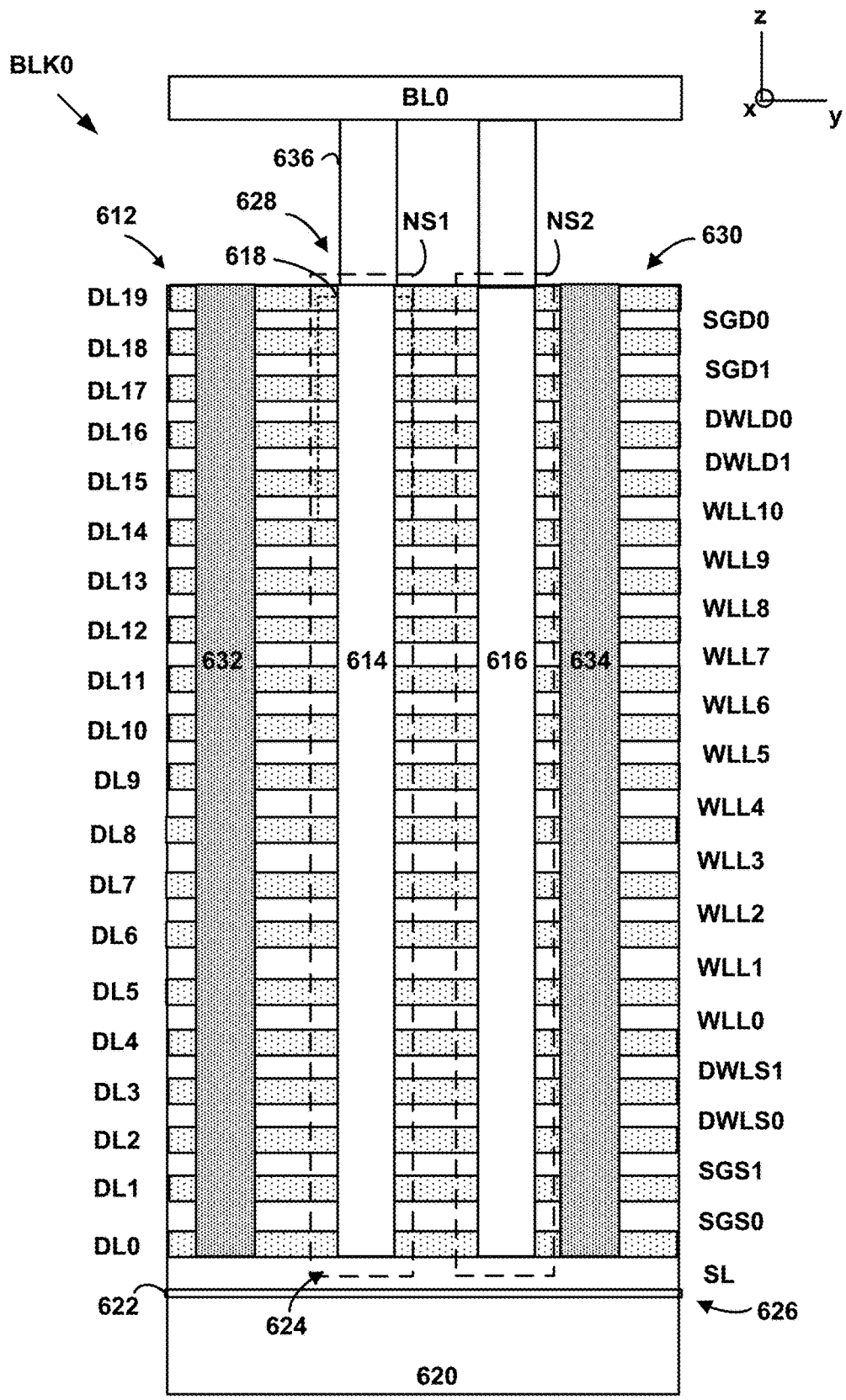
FIG. 6B depicts an example cross-sectional view of a portion of one of the blocks of FIG. 6A.

FIG. 6B depicts an example cross-sectional view of a portion of one of the blocks (e.g., BLK0) of FIG. 6A. Block BLK0 includes a stack 612 of alternating conductive and dielectric layers. In this example, the conductive layers include two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of stack 612 which include NAND strings NS1 and NS2 are depicted. Each NAND string encompasses a memory hole 614 or 616 which is filled with materials which form memory cells adjacent to the word lines. A region 618 of the stack is shown in greater detail in FIG. 6C.

Stack 612 includes a substrate 620, an insulating film 622 on substrate 620, and a portion of a source line SL. NS1 has a source-end 624 at a bottom 626 of stack 612 and a drain-end 628 at a top 630 of stack 612. Metal-filled slits 632 and 634 may be provided periodically across stack 612 as interconnects which extend through stack 612, such as to connect source line SL to a line above stack 612. Slits 632 and 634 may be used during the formation of the word lines and subsequently filled with metal. A portion of a bit line BL0 is also depicted. A conductive via 636 connects the drain-end 628 to BL0.

Figure 6C:
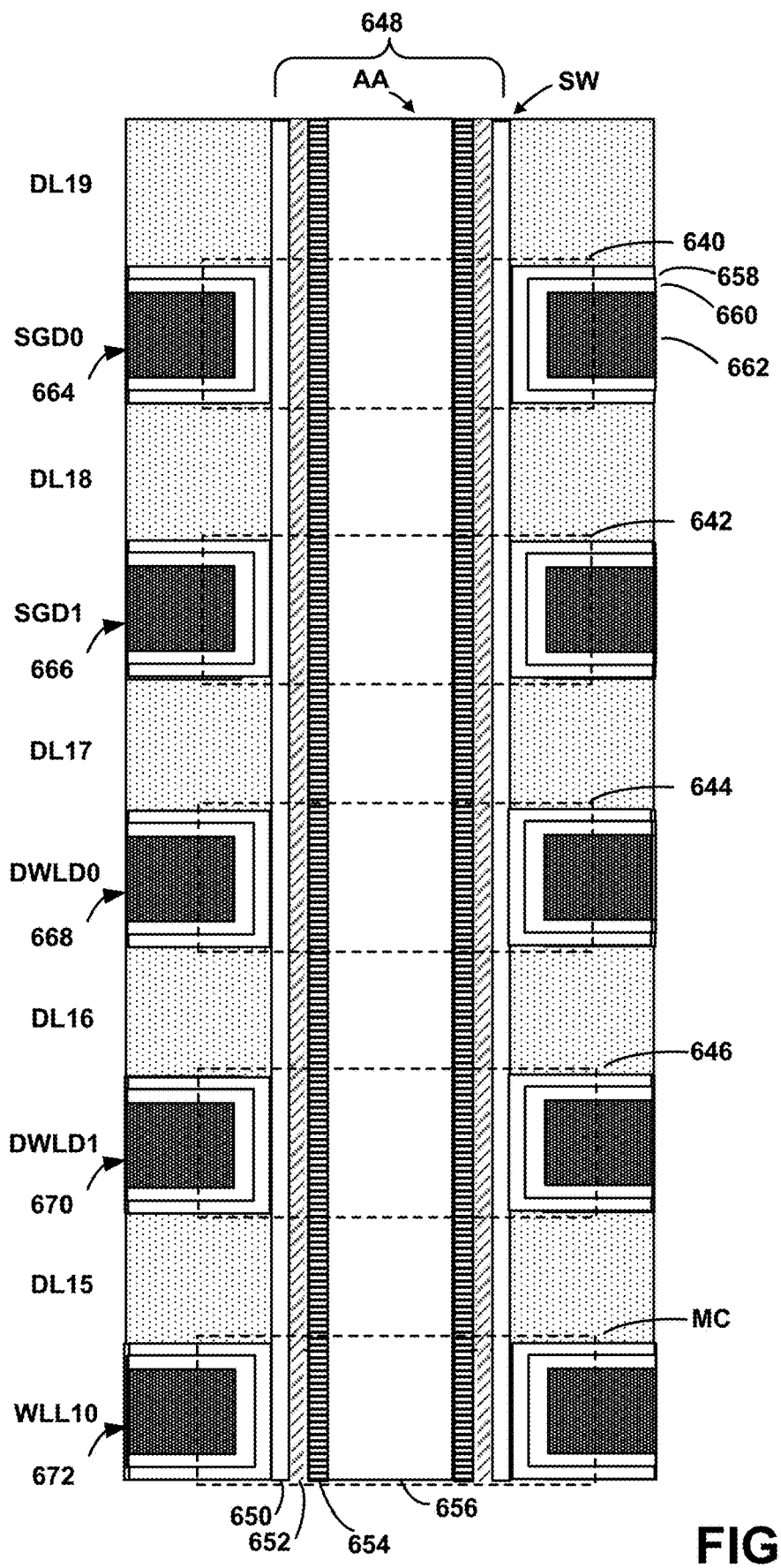
FIG. 6C depicts a close-up view of region 618 of the stack of FIG. 6B.

FIG. 6C depicts a close-up view of the region 618 of the stack of FIG. 6B. Memory cells are formed at the different levels of the stack at the intersection of a word line layer and a memory hole. In this example, SGD transistors 640 and 642 are provided above dummy memory cells 644 and 646 and a data memory cell MC. A number of layers can be deposited along the sidewall (SW) of the memory hole 648 and/or within each word line layer, e.g., using atomic layer deposition. For example, each column (e.g., the pillar which is formed by the materials within a memory hole) can include a charge-trapping layer or film 650 such as SiN or other nitride, a tunneling layer 652, a polysilicon body or channel 654, and a dielectric core 656.

A word line layer can include a blocking oxide/block high-k material 658, a metal barrier 660, and a conductive metal 662 such as tungsten as a control gate. For example, control gates 662, 664, 666, 668 and 670 are provided. In this example, all of the layers except the metal are provided in the memory hole. In other embodiments, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The threshold voltage Vth of a memory cell is increased in proportion to the amount of stored charge. During an erase operation, the electrons return to the channel.

Each of the memory holes can be filled with a plurality of annular layers including a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
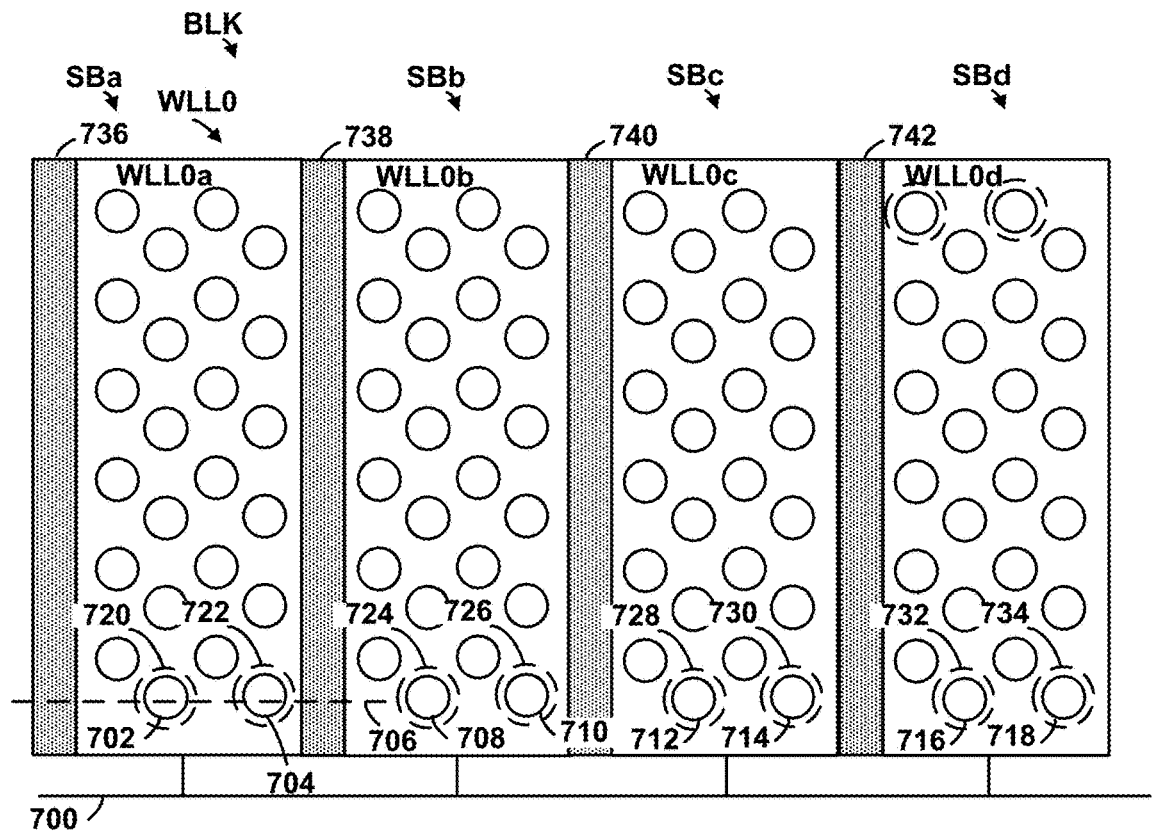
FIG. 7A depicts a top view of an example word line layer WLL0 of the stack of FIG. 6B.

FIG. 7A depicts a top view of an example word line layer WLL0 of stack 612 of FIG. 6B. As previously mentioned, a three-dimensional memory device can include a stack of alternating conductive and dielectric layers. The conductive layers provide the control gates of the SGS/SGD transistors and memory cells. The layers used for the SGS/SGD transistors are select gate layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block includes a set of NAND strings which have a common SGD control line (e.g., the SGD lines/control gates SGD0, SGD1, SGD2 and SGD3 in the sub-blocks SBa, SBb, SBc and SBd, respectively). Further, a word line layer in a block can be divided into regions. Each region is in a respective sub-block can extend between slits which are formed periodically in the stack to process the word line layers during the fabrication process of the memory device. This processing can include replacing a sacrificial material of the word line layers with metal.

Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits.

The layout of the memory holes and slits should also account for a limit in the number of bit lines which can extend across the region while each bit line is connected to a different memory cell. After processing the word line layers, the slits can optionally be filed with metal to provide an interconnect through the stack. FIG. 7A and other figures are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a connector 700. The last region of a word line layer in a block can be connected to a first region of a word line layer in a next block, in one approach. Connector 700, in turn, is connected to a voltage driver for the word line layer.

Figure 7B:
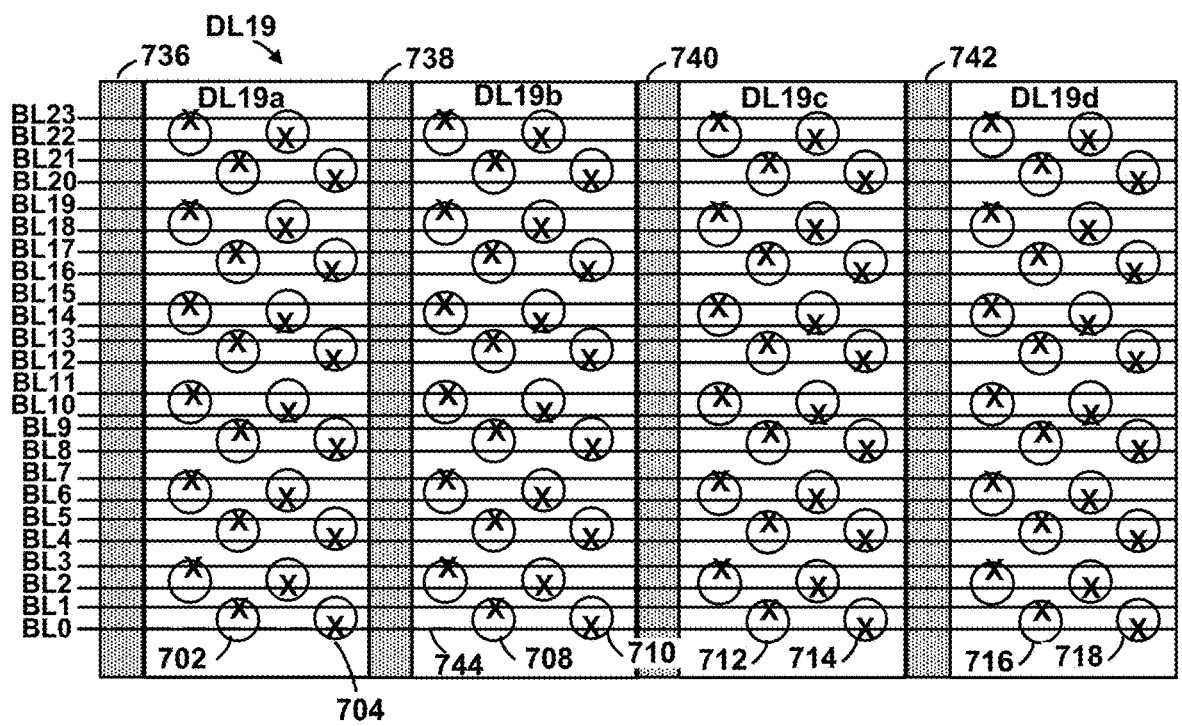
FIG. 7B depicts a top view of an example top dielectric layer DL19 of the stack of FIG. 6B.

Region WLL0a has example memory holes 702 and 704 along a line 706. Region WLL0b has example memory holes 708 and 710. Region WLL0c has example memory holes 712 and 714. Region WLL0d has example memory holes 716 and 718. The memory holes are also shown in FIG. 7B. Each memory hole can be part of a respective NAND string. For example, memory holes 702, 708, 712 and 716 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 722 are in WLL0a, memory cells 724 and 726 are in WLL0b, memory cells 728 and 730 are in WLL0c, and memory cells 732 and 734 are in WLL0d. These memory cells are at a common height in the stack.

Metal-filled slits 736, 738, 740 and 742 (e.g., metal interconnects) may be located between and adjacent to the edges of the regions WLL0a-WLL0d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B depicts a top view of an example top dielectric layer DL19 of the stack of FIG. 6B. Dielectric layer DL19 is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

Region DL19a has the example memory holes 702 and 704 along a line 744 which is coincident with a bit line BL0. A number of bit lines extend above the memory holes and are connected to the memory holes as indicated by the "X" symbols. BL0 is connected to a set of memory holes which includes memory holes 704, 710, 714 and 718. Another example bit line BL1 is connected to a set of memory holes which includes memory holes 702, 708, 712 and 716. Metal-filled slits 736, 738, 740 and 742 from FIG. 7A also are depicted, as they extend vertically through the stack. The bit lines can be numbered in a sequence BL0-BL23 across the DL19 layer in the x-direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
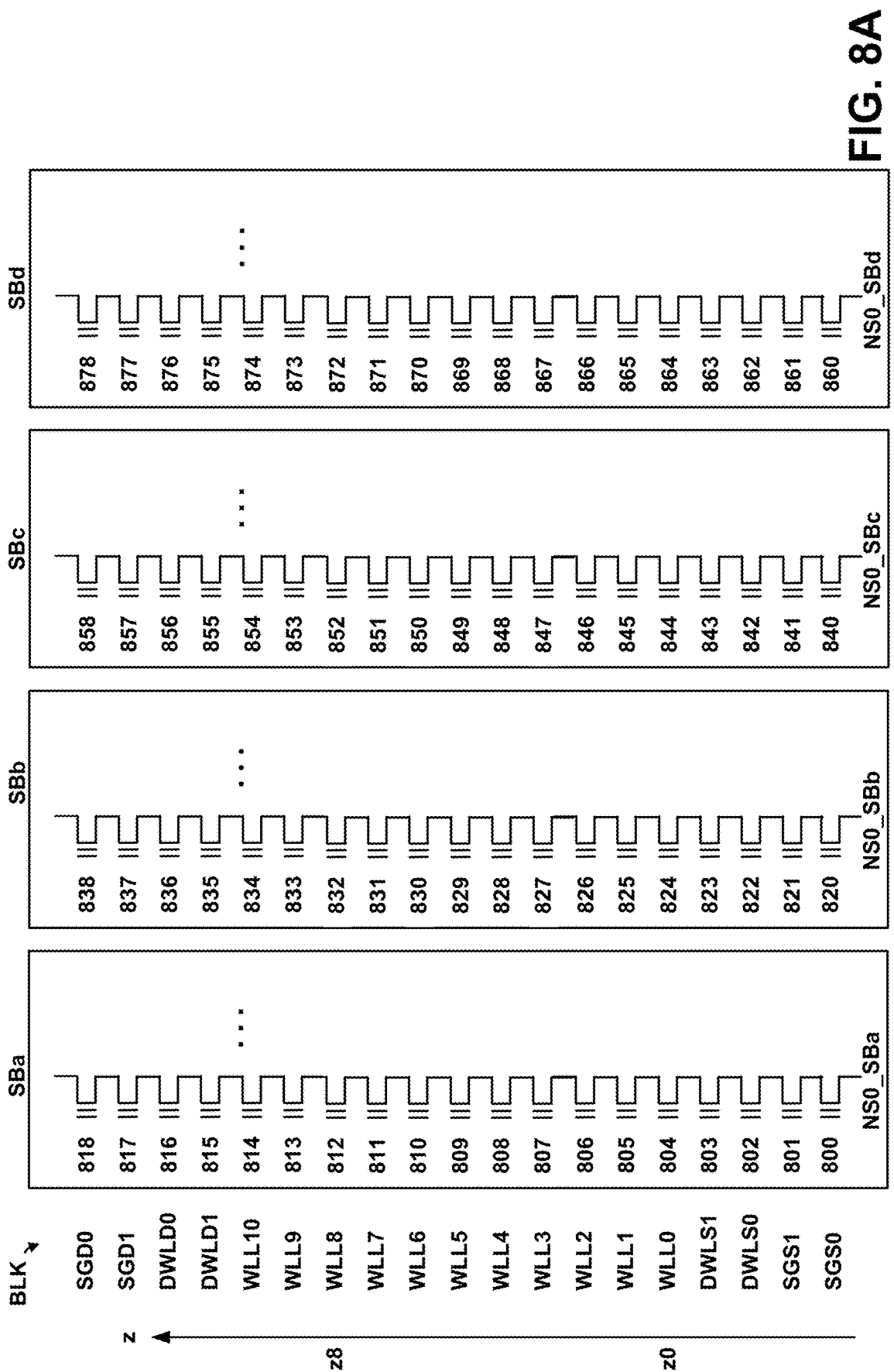
FIG. 8A depicts example NAND strings in the sub-blocks SBa-SBd of FIG. 7A.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa includes an example NAND string NS0_SBa, SBb includes an example NAND string NS0_SBb, SBc includes an example NAND string NS0_SBc, and SBd includes an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the another set of memory cells (e.g., including the memory cell 812) connected to another word line (e.g., WLL8) are at another height (z8) in the stack.

Figure 8B:
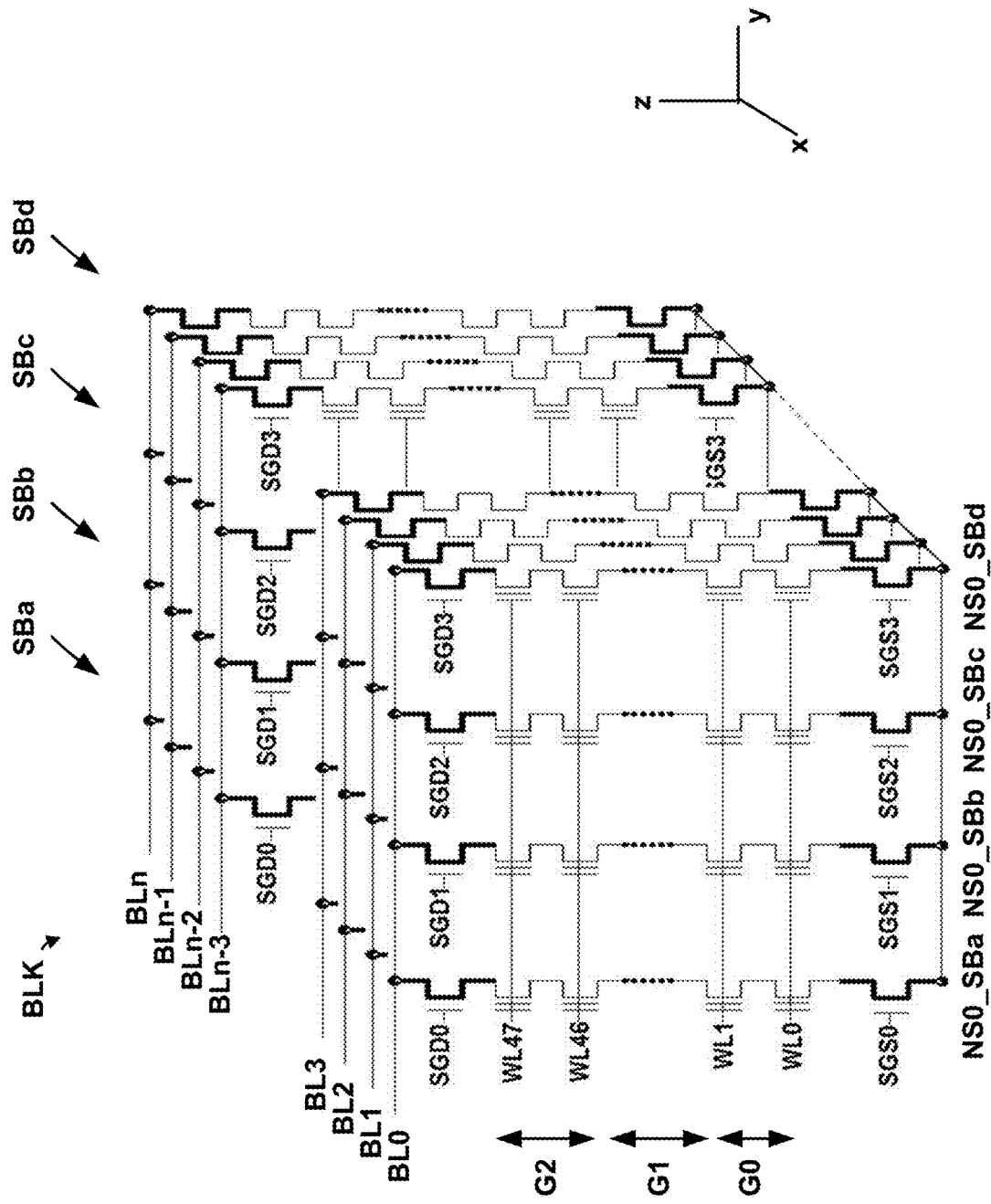
FIG. 8B depicts another example view of NAND strings in sub-blocks.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block includes a set of NAND strings which extend in the x direction and which have a common SGD line, e.g., SGD0, SGD1, SGD2 or SGD3. In this simplified example, there is only one SGD transistor and one SGS transistor in each NAND string. NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

A programming operation for a set of memory cells typically involves applying a series of program voltage (Vpgm) pulses to the memory cells after the memory cells are provided in an erased state. Each Vpgm pulse is provided in a program loop, also referred to as a program-verify iteration. For example, the Vpgm pulses may be applied to a word line which is connected to control gates of the memory cells.

In an embodiment, incremental step pulse programming is performed wherein the Vpgm pulse amplitude is increased by a step size in each program loop. Verify operations may be performed after each Vpgm pulse to determine whether the memory cells have completed programming. When programming is completed for a memory cell, the memory cell can be locked out from further programming while programming continues for other memory cells in subsequent program loops.

Each memory cell may be associated with a memory state according to write data in a program command. Based on its memory state, a memory cell will either remain in the erased state or be programmed to a memory state (a programmed memory state) different from the erased state. For example, in a two-bit per cell memory device, there are four memory states including the erased state and three programmed memory states referred to as the A, B and C memory states. In a three-bit per cell memory device, there are eight memory states including the erased state and seven programmed memory states referred to as the A, B, C, D, E, F and G memory states. In a four-bit per cell memory device, there are sixteen memory states including the erased state and fifteen programmed memory states referred to as the Er, S1, S2, S3, S4, S5, S6, S7, S8, S9, S10, S11, S12, S13, S14 and S15 memory states.

FIG. 9A depicts an embodiment of threshold voltage Vth distributions for a four-state memory device in which each memory cell stores two bits of data. A first threshold voltage Vth distribution 900 is provided for erased (Er-state) storage elements. Three threshold voltage Vth distributions 902, 940 and 906 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

FIG. 9B depicts an embodiment of threshold voltage Vth distributions for an eight-state memory device in which each memory cell stores three bits of data. A first threshold voltage Vth distribution 910 is provided for Er-state storage elements. Seven threshold voltage Vth distributions 912, 914, 916, 918, 920, 922 and 924 represent programmed memory states A, B, C, D, E, F and G, respectively. A 3-bit code having lower, middle and upper bits can be used to represent each of the eight memory states. In an embodiment, the "Er," "A," "B," "C," "D," "E," "F" and "G" memory states are respectively represented by "111," "011," "001," "000," "010," "110," "100" and "101."

FIG. 9C depicts an embodiment of threshold voltage Vth distributions for a sixteen-state memory device in which each memory cell stores four bits of data. A first threshold voltage Vth distribution 930 is provided for erased Er-state storage elements. Fifteen threshold voltage Vth distributions 932, 934, 936, 938, 940, 942, 944, 946, 948, 950, 952, 954, 956, 958 and 960 represent programmed memory states S1, S2, S3, S4, S5, S6, S7, S8, S9, S10, S11, S12, S13, S14 and S15, respectively.

Figure 10A:
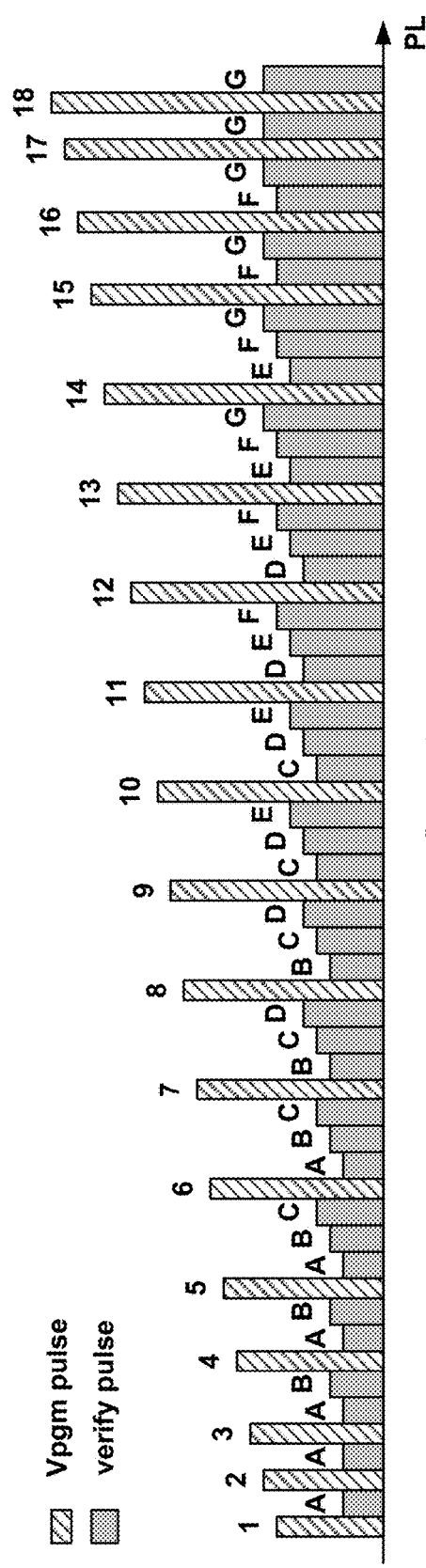
FIG. 10A depicts a waveform of an example memory cell programming operation.

FIG. 10A depicts a waveform of an example memory cell programming operation for an eight-state memory device having an erased state (Er) and seven programmed memory states (e.g., A, B, C, D, E, F and G), such as depicted in FIG. 9B. The horizontal axis depicts a program loop number and the vertical axis depicts control gate or word line voltage. Generally, a programming operation can involve applying a pulse train to a selected word line, where the pulse train includes multiple program loops or program-verify iterations. The program portion of the program-verify iteration includes a Vpgm pulse, and the verify portion of the program-verify iteration includes one or more verify pulses.

For each Vpgm pulse, a square waveform is depicted for simplicity, although other shapes are possible such as a multilevel shape or a ramped shape. Further, Incremental Step Pulse Programing (ISPP) is used in this example, in which the Vpgm pulse amplitude steps up in each successive program loop. This example uses ISPP in a single programming pass in which the programming is completed. ISPP also can be used in each programming pass of a multi-pass operation.

A pulse train typically includes Vpgm pulses which increase stepwise in amplitude in each program-verify iteration using a fixed or varying step size. A new pulse train starts at an initial Vpgm pulse level and ends at a final Vpgm pulse level which does not exceed a maximum allowed level.

Vpgm pulses are applied to a word line selected for programming, and an associated set of non-volatile memory cells. One, two or three verify voltage pulses are provided after each Vpgm pulse as an example, based on the target memory states which are being verified. A voltage of 0V may be applied to the selected word line between the Vpgm pulses and verify voltage pulses.

Figure 10B:
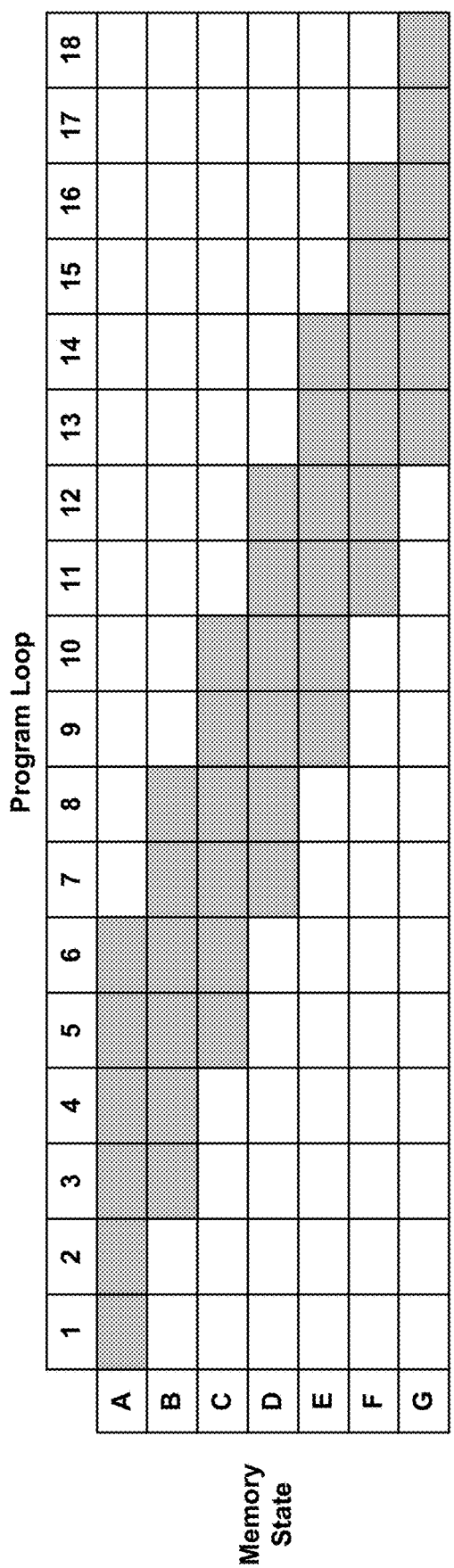
FIG. 10B is a table specifying the verify pulses that are applied during each program loop in the example waveform of FIG. 10A.

FIG. 10B is a table specifying the verify pulses that are applied during each program loop in the example waveform of FIG. 10A. In particular, an A-state verify voltage is applied after each of the first through sixth Vpgm pulses, a B-state verify voltage is applied after each of the third through eighth Vpgm pulses, a C-state verify voltage is applied after each of the fifth through tenth Vpgm pulses, a D-state verify voltage is applied after each of the seventh through twelfth Vpgm pulses, an E-state verify voltage is applied after each of the ninth through fourteenth Vpgm pulses, an F-state verify voltage is applied after each of the eleventh through sixteenth Vpgm pulses, and a G-state verify voltage is applied after each of the thirteenth through eighteenth Vpgm pulses.

FIG. 11 is a flowchart of an example process 1100 for programming memory cells. In an embodiment, process 1000 may be performed in a memory device, such as memory device 100 of FIG. 1. At step 1102, a word line is selected for programming. In an embodiment, the selected word line is coupled to one or more memory cells. In an embodiment, each memory cell coupled to the selected word line is in an Er-state prior to programming. In an embodiment, during programming, each memory cell coupled to the selected word line will be left in the Er-state or programmed to one of multiple programmed memory states, such as the programmed memory states depicted in FIGS. 9A-9C.

In an embodiment, each memory cell coupled to the selected word line is associated with one or more data latches used to store a code that represents the particular memory state of the memory cell. For example, FIG. 9B depicts an example 3-bit code used to represent each of eight memory states. In an embodiment, prior to programming a memory cell, the associated data latches for the memory cell are loaded with the code representing the particular memory state of the memory cell.

At step 1104, an initial Vpgm pulse amplitude is set. In an embodiment, the initial Vpgm pulse amplitude may be between about 8V and about 30 V, although other values may be used.

At step 1106, a Vpgm pulse is applied to the selected word line. In the first iteration of step 1106, the applied Vpgm pulse has the pulse amplitude specified in step 1104. As described above, prior to programming, each memory cell coupled to the selected word line is in an Er-state. As a result of applying the Vpgm pulse to the selected word line, the threshold voltage Vth of memory cells coupled to the selected word line are shifted higher. The amount of threshold voltage Vth shift varies from memory cell to memory cell, resulting in a threshold voltage Vth distribution across the population of memory cells coupled to the selected word line.

At step 1108, a verification signal (e.g., a waveform including one or more verify pulses) is applied to the selected word line while performing verify tests for one or more memory states. The verify tests determine if the threshold voltage Vth of each memory cell has shifted above particular verify voltage levels. In an embodiment, if the threshold voltage Vth of a memory cell has not shifted above the verify voltage level for that memory cell, the code value in the associated data latches for the memory cell are not modified. In an embodiment, if the threshold voltage Vth of a memory cell has shifted above the verify voltage level for that memory cell, the code value in the associated data latches for the memory cell are changed to the code value associated with the Er-state (e.g., "111" in the example of FIG. 9B).

For example, referring again to FIG. 9B, if the threshold voltage Vth of an A-state memory cell has not shifted above verify voltage Vv1, the code value in the associated data latches for the memory cell is not modified and remains "011." If, however, the threshold voltage Vth of an A-state memory cell has shifted above verify voltage Vv1, the code value in the associated data latches for the memory cell is changed to "111."

In an embodiment, corresponding verify tests are performed for state K memory cells (memory cells assigned to represent state K). In another embodiment, corresponding verify tests are performed for state K memory cells, state (K+1) memory cells, and state (K+2) memory cells, where state K, state (K+1) and state (K+2) are three consecutive memory states. For example, at the start of programming K may be the A state of FIG. 9B, and corresponding verify tests are performed for state A cells, state B cells, and state C cells. Persons of ordinary skill in the art will understand that corresponding verify tests may be performed for more or fewer than three states.

In an embodiment, a lockout status is set for memory cells which pass the verify tests of step 1108. For example, referring again to FIG. 9B, a lockout status is set for state A memory cells that pass the corresponding state A verify tests at step 1108, a lockout status is set for state B memory cells that pass the corresponding state B verify tests at step 1108, and so on.

Referring again to FIG. 11A, at step 1110, one or more bitscans are performed. As described above and as used herein, a bitscan is a count of a number of memory cells whose threshold voltage Vth has not shifted above a particular verify voltage level for a particular memory state. For example, a state A bitscan is a count of a number of state A memory cells whose threshold voltage Vth has not shifted above a verify voltage level for state A. Likewise, a state B bitscan is a count of a number of state B memory cells whose threshold voltage Vth has not shifted above a verify voltage level for state B, and so on.

As described above, for an A-state memory cell whose threshold voltage Vth has not shifted above verify voltage Vv1, the code value in the associated data latches for the memory cell is not modified and remains "011." Thus, in an embodiment, a state A bitscan may be performed by counting a number of data latches having code value "011." Likewise, a state B bitscan may be performed by counting a number of data latches having code value "001," and so on.

Figure 11A:
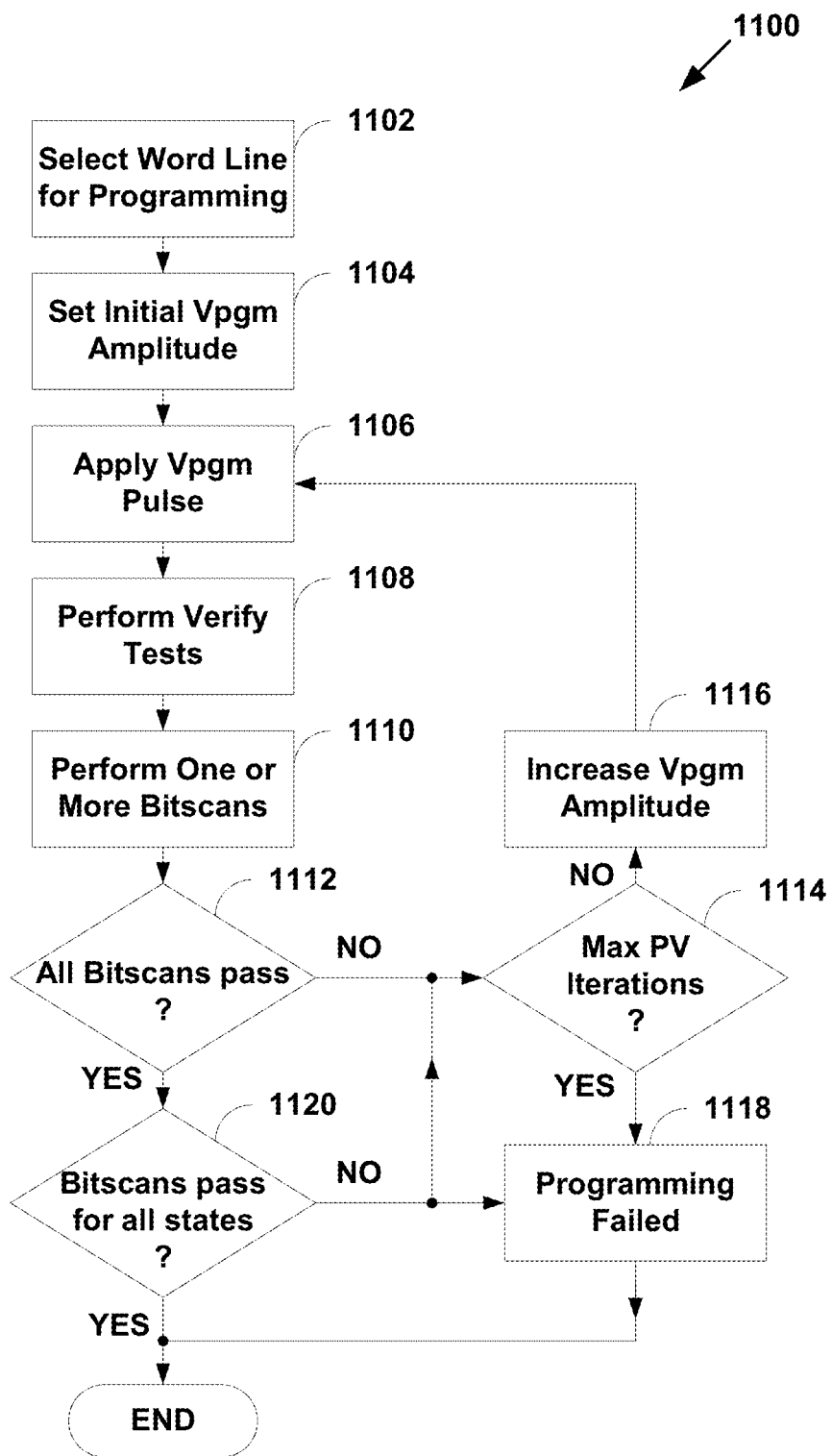
FIG. 11A is a flowchart of an example programming process in a memory device.
Figure 11B:
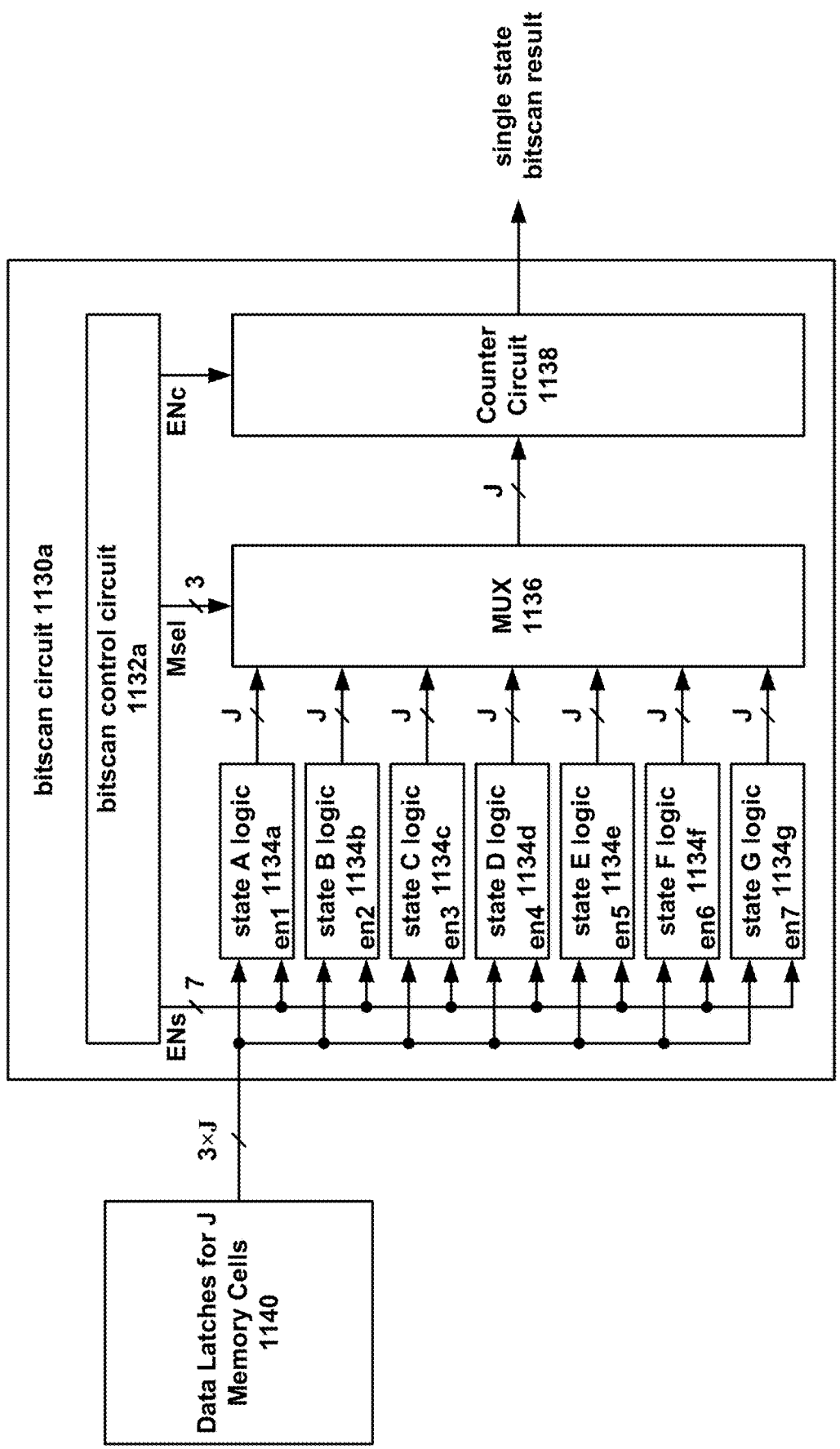
FIG. 11B is a high level block diagram of an embodiment of a bitscan circuit.

FIG. 11B depicts a high level block diagram of an embodiment of a bitscan circuit 1130a for use with a group of J, 3-bit memory cells having the example programmed memory states A-G and code values depicted in FIG. 9B. Bitscan circuit 1130a is an example bitscan operation circuit 150 of FIG. 1. As described in more detail below, bitscan circuit 1130a may be used to calculate a single state bitscan result for any of programmed memory states A-G.

Bitscan circuit 1130a includes a bitscan control circuit 1132a, state A-G logic circuits 1134a-1134g, a J:1 MUX 1136 and a counter circuit 1138. Bitscan circuit 1130a is coupled to data latches for J memory cells 1140, which provide 3×J bits of data to state A-G logic circuits 1134a-1134g. Bitscan control circuit 1132a provides a state enable signal ENs to selectively enable one of state A-G logic circuits 1134a-1134g, provides a mux select signal Mse1 to J:1 MUX 1136 to selectively couple the J-bit output of one of state A-G logic circuits 1134a-1134g to a J-bit input of counter circuit 1138, and provides a counter enable signal ENc to trigger counter circuit 1138 to perform a count of the number of bits having a value "1" in the J-bit input to counter circuit 1138.

FIG. 11C depicts a diagram of an embodiment of state A-G logic circuits 1134a-1134g coupled to data latches ADL-CDL. FIG. 11C also includes a table showing the example data latch values for the erased state Er and each of programmed memory states A-G. Each of state A-G logic circuits 1134a-1134g is coupled to J sets of data latches ADL-CDL, and includes J sets of 3-input NAND gates, each coupled to a corresponding one of the J sets of data latches ADL-CDL.

An inverter is coupled between a data latch and a corresponding input of the 3-input NAND gate for each state code value equal to "0." Thus, for programmed memory state A (code value "011"), an inverter is coupled between data latch ADL and the corresponding input to the 3-input NAND gate. Likewise, for programmed memory state D (code value "010"), an inverter is coupled between each of data latches ADL and CDL and the corresponding input to the 3-input NAND gate.

Each AND gate provides an output of "1" if the data latch values ADL-CDL match the code value for the particular programmed memory state, and provides an output of "0" if all data latches ADL-CDL have values other than the code value for the particular data state. Thus, state A logic circuit 1134a will provide a J-bit wide output bsA, with a "1" for each memory cell having associated data latch ADL-CDL values "011," and a "0" for each memory cell having any other associated data latch ADL-CDL values. Likewise, state E logic circuit 1134e will provide a J-bit wide output bsE, with a "1" for each memory cell having associated data latch ADL-CDL values "110," and a "0" for each memory cell having any other associated data latch ADL-CDL values.

Referring again to FIG. 11B, to perform a state A bitscan, bitscan control circuit 1132a selectively enables state A logic circuit 1134a, and provides mux select signal Mse1 to J:1 MUX 1136 to selectively couple the J-bit output bsA of state A logic circuit 1134a to the J-bit input of counter circuit 1138. Control circuit 1132a provides counter enable signal ENc to trigger counter circuit 1138 to perform a count of the number of bits having a value "1" in J-bit output bsA of state A logic circuit 1134a. The count is the state A bitscan.

Alternatively, to perform a state F bitscan, bitscan control circuit 1132a selectively enables state F logic circuit 1134f, and provides mux select signal Mse1 to J:1 MUX 1136 to selectively couple the J-bit output bsF of state F logic circuit 1134f to the J-bit input of counter circuit 1138. Control circuit 1132a provides counter enable signal ENc to trigger counter circuit 1138 to perform a count of the number of bits having a value "1" in J-bit output bsF of state F logic circuit 1134f. The count is the state F bitscan.

As described above, bitscan circuit 1130a can be used to perform a single state bitscan for any of states A-F. To perform a multiple-state bitscan, bitscan control circuit 1132a can be configured to perform multiple single-state bitscans in sequence. For example, to perform bitscans for states A, B and C, control circuit 1132a can be configured to perform a state A bitscan, then perform a state B bitscan and then perform a state C bitscan.

Alternatively, multiple bitscan circuits 1130a may be used to perform a multi-state bitscan. For example, a first bitscan circuit 1130a may be used to perform a state A bitscan, a second bitscan circuit 1130a may be used to perform a state B bitscan, and a third bitscan circuit 1130a may be used to perform a state C bitscan, and so on.

Referring again to FIG. 11A, at step 1112 a determination is made whether each of the bitscans performed in step 1110 "pass." As used herein, a bitscan is said to "pass" if the bitscan count for a particular state is less than a predetermined value. Conversely, a bitscan is said to "fail" if the bitscan for a particular state is greater than or equal to the predetermined value. In an embodiment, the predetermined value is less than a number of read errors that can be corrected by an ECC engine, such as ECC engine 128 of FIG. 1. Other values may be used for the predetermined value.

If at step 1112 all bitscans performed in step 1110 are determined not to have passed, at step 1114 a determination is made whether a maximum number of program-verify (PV) iterations has been performed. If at step 1114 the number of PV iterations has not exceeded a maximum, at step 1116 the Vpgm pulse amplitude is increased. In embodiment, the Vpgm pulse amplitude may be increased between about 0.1V to about 0.8V, although other values may be used. If at step 1114 the number of PV iterations has exceeded a maximum, at step 1118 programming is deemed to have failed, and process 1100 ends.

If at step 1112 all bitscans performed in step 1110 are determined to have passed, at step 1120 a determination is made whether bitscans have passed for all programming states. If at step 1120 all bitscans are determined to have not yet passed for all programming states, the process proceeds to step 1114, described above. If at step 1120 all bitscans are determined to have passed for all programming states, programming is complete and process 1100 ends.

In example process 1100, when bitscans for a particular programmed memory state pass, programming of memory cells for that programmed memory state are complete. The program loop in which bitscans for a particular programmed memory state pass is referred to herein as the "passed program loop." For example, referring again to FIGS. 10A-10B, the passed program loop for programmed memory states A, B, C, D, E, F and G are program loops 6, 8, 10, 12, 14, 16 and 18, respectively.

In example process 1100 of FIG. 11A, when programming of memory cells for a particular programmed memory state is complete, no additional verify pulses for that programmed memory state are used. In other words, no verify pulses for the particular programmed memory state are used in program loops after the passed program loop for that programmed memory state.

For example, referring again to FIGS. 10A-10B, programming of memory cells for programmed memory state A is complete in program loop 6, and no verify pulses for programmed memory state A are used in program loops after state A passed program loop 6. Similarly, programming of memory cells for programmed memory state B is complete in program loop 8, and no verify pulses for programmed memory state B are used in program loops after state B passed program loop 8.

Short term data retention is a common reliability issue for memory devices, such as charge trap memory, and usually is caused by the insecure charge loss (electrons or holes) from some traps with shallow energy levels. The impact of short term data retention is a shift of memory cell threshold voltage Vth in short term (e.g., on the order of microseconds) after programming completes for the memory cell. In particular, threshold voltage Vth of the memory cell shifts below the verify voltage level for the memory cell. For nonvolatile memory, the higher the state the worse the short term data retention. Memory cells that experience such threshold voltage Vth shift are referred to herein as "STDR memory cells."

Figure 12:
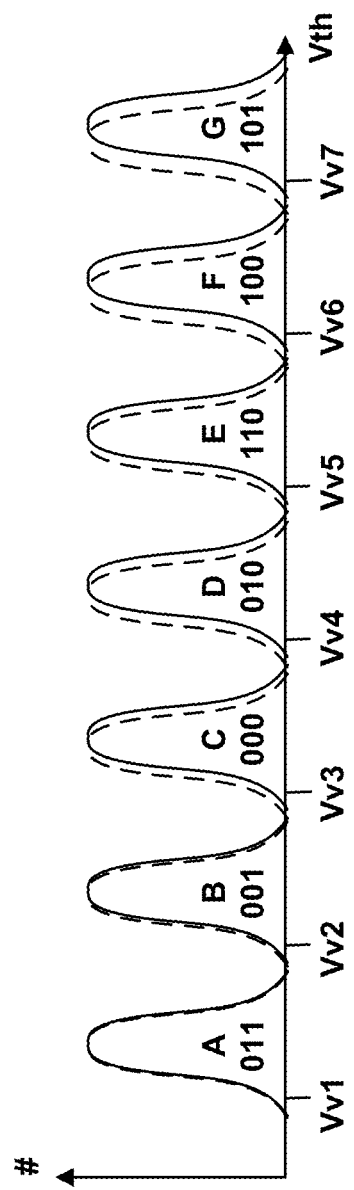
FIG. 12 depicts an embodiment of threshold voltage distributions for an eight-state memory device in which each memory cell stores three bits of data.

For example, FIG. 12 depicts example threshold voltage Vth distributions for programmed memory states A, B, C, D, E, F and G of an eight-state memory device in which each memory cell stores three bits of data. The solid line represents the threshold voltage Vth distributions immediately after programming completes for each programmed memory state, and the dashed curve represents the short term data retention threshold voltage Vth shift that occurs after programming completes for each programmed memory state. As depicted in the diagram, the threshold voltage Vth shifts lower, and the higher the state the worse the short term data retention.

Figure 13A:
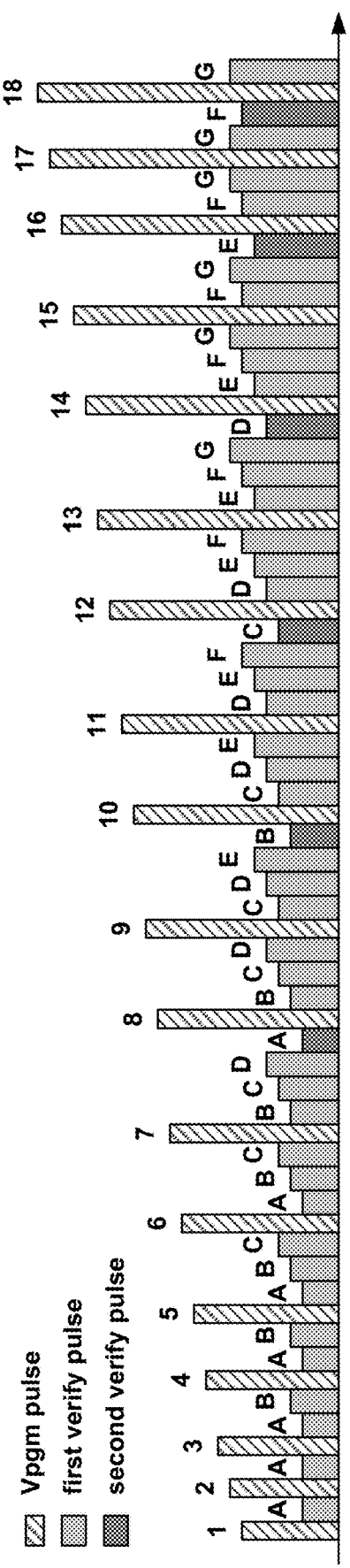
FIG. 13A depicts a waveform of an example memory cell programming operation.

FIG. 13A depicts a waveform of another example memory cell programming operation for an eight-state memory device having an erased state (Er) and seven programmed memory states (e.g., A, B, C, D, E, F and G), such as depicted in FIG. 9B. The horizontal axis depicts a program loop number and the vertical axis depicts control gate or word line voltage. As in the example of FIG. 10A, a programming operation involves applying a pulse train to a selected word line, where the pulse train includes multiple program loops or program-verify iterations. The program portion of the program-verify iteration includes a Vpgm pulse, and the verify portion of the program-verify iteration includes one or more verify pulses.

Vpgm pulses are applied to a word line selected for programming, and an associated set of non-volatile memory cells. One, two, three or four verify voltage pulses are provided after each Vpgm pulse as an example, based on the target memory states which are being verified. A voltage of 0V may be applied to the selected word line between the Vpgm pulses and verify voltage pulses.

Figure 13B:
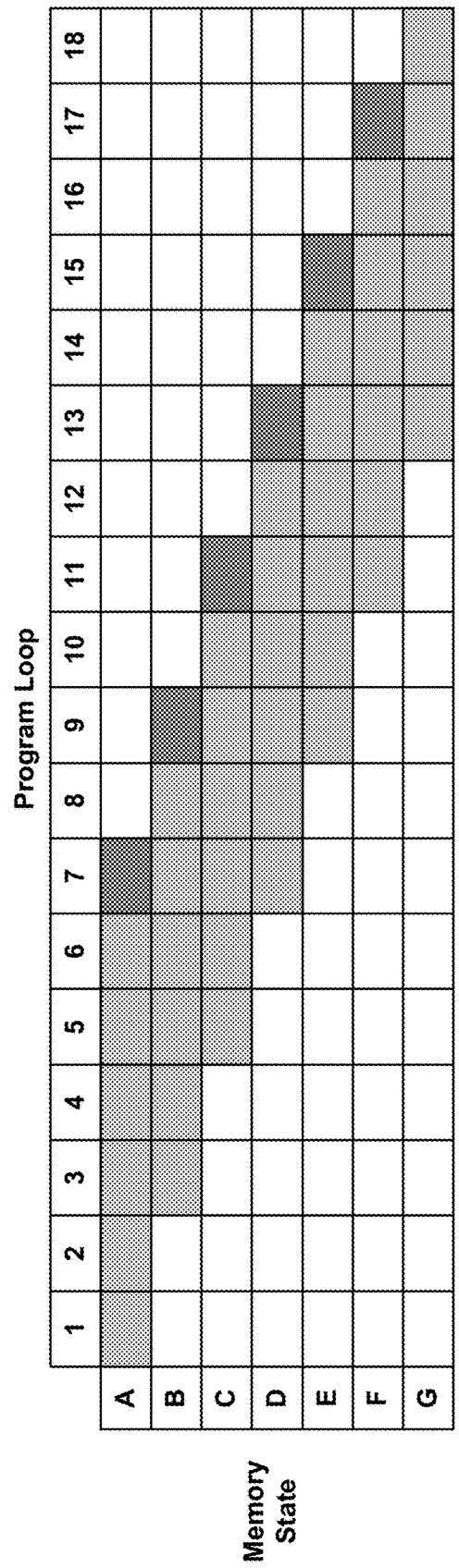
FIG. 13B is a table specifying the verify pulses that are applied during each program loop in the example waveform of FIG. 13A.

The example waveform of FIG. 13A is similar to the example waveform of FIG. 10A, but also includes an additional verify pulse for each of programmed memory states A-F. In particular, for each programmed memory state A-F the program waveform includes one or more first verify pulses and a second verify pulse. In the example of FIG. 13A, first verify pulses are shaded light gray, and second verify pulses are shaded dark gray. FIG. 13B is a table specifying the first verify pulses and second verify pulses that are applied during each program loop in the example waveform of FIG. 13A.

In an embodiment, first verify pulses are used to determine if the threshold voltage Vth of each memory cell has shifted above particular verify voltage levels. In particular, for a given programmed memory state first verify pulses are applied up to and including the passed program loop for that programmed memory state. In the example of FIGS. 13A-13B, first verify pulses for A-state memory cells are applied up to and including the state A passed program loop 6. Similarly, first verify pulses for B-state memory cells are applied up to and including the state B passed program loop 8, and so on.

In an embodiment, second verify pulses are used to identify any STDR memory cells whose threshold voltage Vth has shifted (e.g., as a result of short term data retention) after programming completes for a given programmed memory state. In particular, for a given programmed memory state a second verify pulse is applied in a program loop after the passed program loop for that programmed memory state.

So, for example, if the passed program loop for a programmed memory state is N, a second verify pulse for the programmed memory state is applied in a program loop N+i, where i≥1. The term "extra verify program loop" is used herein to describe the program loop in which the second verify pulse is applied for a programmed memory state.

In the example of FIGS. 13A-13B, with i=1, the A-state extra verify program loop is program loop 7, the B-state extra verify program loop is program loop 9, the C-state extra verify program loop is program loop 11, the D-state extra verify program loop is program loop 13, the E-state extra verify program loop is program loop 15, and the F-state extra verify program loop is program loop 17.

Persons of ordinary skill in the art will understand that i alternatively may have values greater than 1 (e.g., i=2, 3, . . . ). In addition, in the example of FIG. 13A the same value of i is used for all programmed memory states A-F. In other embodiments, each programmed memory state may have its own corresponding i-value, and the i=values need not all be the same for all programmed memory states.

In an embodiment, the second verify pulse for a programmed memory state is applied after all first verify pulses have been applied in the extra verify program loop. In the example of FIG. 13A, the A-state second verify pulse is applied in extra verify program loop 7 after first verify pulses have been applied for programmed memory states B, C and D. Similarly, the B-state second verify pulse is applied in extra verify program loop 9 after first verify pulses have been applied for programmed memory states C, D and E, and so on.

Without wanting to be bound by any particular theory, it is believed that applying the second verify pulse after all first verify pulses have been applied provides time for any threshold voltage Vth drift to occur in the memory cells. Persons of ordinary skill in the art will understand that the second verify pulse for each state alternatively may be applied in some other sequence in the extra verify program loop. For example, the second verify pulse for a state may be applied before all first verify pulses have been applied in the extra verify program loop. Alternatively, the second verify pulse for each state may be applied between first verify pulses in the extra verify program loop.

As described above, the second verify pulse for each programmed memory state is used to identify any STDR memory cells whose threshold voltage Vth has shifted after programming completes for the programmed memory state. So, for example, the A-state second verify pulse applied in extra verify program loop 7 is used to identify A-state STDR memory cells, the B-state second verify pulse applied in extra verify program loop 9 is used to identify B-state STDR memory cells, and so on.

In an embodiment, after the STDR memory cells for a particular programmed memory state are identified, program pulses are applied to the identified STDR memory cells to move the threshold voltage Vth of such identified memory cells. In an embodiment, program pulses are applied to the identified STDR memory cells to shifted the threshold voltage Vth of such STDR memory cells above the corresponding verify voltage levels for such memory cells. Such program pulses are referred to herein as "extra program pulses."

In an embodiment, an extra program pulse for a particular programmed memory state is applied in a program loop after the extra verify program loop for that programmed memory state. So, for example, if the passed program loop for a programmed memory state is a first program loop N and the extra verify program loop for the programmed memory state is applied in a second program loop N+i (i≥1), the extra program pulse for the programmed memory state is applied in a third program loop N+i+j (i≥1, j≥1, N+i+j≤maximum loop count). The term "re-program program loop" is used herein to describe the program loop in which the extra program pulse is applied for a programmed memory state.

In the example of FIGS. 13A-13B, with i=1 and j=1, the A-state re-program program loop is program loop 8, the B-state re-program program loop is program loop 10, the C-state re-program program loop is program loop 12, the D-state re-program program loop is program loop 14, the E-state re-program program loop is program loop 16, and the F-state re-program program loop is program loop 18.

In an embodiment, during reprogramming of STDR memory cells, bit lines coupled to STDR memory cells are raised to a quick pass write (QPW) voltage. In a QPW arrangement, memory cells that are selected for programming that are approaching their target level are partially inhibited to slow the programming process for better accuracy by raising their bit line levels to QPW voltage above ground. For example, in some embodiments the QPW voltage is approximately 1V.

In an embodiment, in the re-program program loop selected bit lines coupled to STDR memory cells are biased to the QPW voltage, selected bit lines coupled to memory cells that are to be programmed are biased to GROUND (e.g., 0V), and unselected bit lines coupled to memory cells that are locked out from programming are biased to an inhibit voltage (e.g., Vdd).

As described above, when a program command is issued the write data are stored in data latches associated with the memory cells. For example, in a three-bit per cell memory device, each memory cell is associated with three data latches (e.g., ADL, BDL, CDL) that store the three-bit write data for the memory cell. During programming, the data latches of a memory cell can be read to determine the memory state to which the cell is to be programmed.

In an embodiment, during verify operations the code value in the associated data latches (e.g., ADL, BDL, CDL) for a memory cell are not modified if the threshold voltage Vth of a memory cell has shifted above the verify voltage level for that memory cell. In this regard, the associated data latches for a memory cell retain their code values so that second verify pulses may be used to identify any STDR memory cells whose threshold voltage Vth has shifted after programming completes for the programmed memory state.

For example, FIG. 14 is a table depicting example values of ADL, BDL, CDL for a memory cell to be programmed to the B programmed memory state. In this example, for the B programmed memory state, ADL=0, BDL=0, CDL=1. Persons of ordinary skill in the art will understand that alternative code values may be used to represent the B programmed memory state.

The table of FIG. 14 also includes three additional data latches: SEN, TDL and SDL. During verify operations, SEN=0 if the threshold voltage Vth of the associated memory cell has not shifted above the verify voltage level for the memory cell, and SEN=1 if the threshold voltage Vth of the associated memory cell has shifted above the verify voltage level for the memory cell.

In an embodiment, TDL=TDL|SEN, and SDL=SDL|SEN, where the "|" symbol represents a logical OR operation. In an embodiment, the values of data latches TDL and SDL can be used to distinguish three types of memory cells. In particular, TDL=0, SDL=0 corresponds to a memory cell that has not completed programming—that is, the threshold voltage Vth of the memory cell has not shifted above the verify voltage level for the memory cell.

In contrast, TDL=1, SDL=0 corresponds to a memory cell that previously completed programming, but was identified as an STDR memory cell during an extra verify program loop. In the re-program program loop for such memory cells, selected bit lines coupled to STDR memory cells are biased to the QPW voltage.

In addition, TDL=1, SDL=1 corresponds to a memory cell that completed programming and is inhibited from further programming.

As seen in the example of FIG. 14, during the entire programming operation, the values of data latches ADL, BDL and CDL remain the same and are not reset.

In one embodiment, an apparatus is provided that includes a memory die having a first memory cell, and a controller connected to the memory die. The controller is configured to apply a plurality of programming pulses to the first memory cell, apply a plurality of first verify pulses to the first memory cell, determine from the first verify pulses that the first memory cell has been programmed to a first programmed memory state, apply a single second verify pulse to the first memory cell after determining that the first memory cell has been programmed to the first programmed memory state, determine from the single second verify pulse that the first memory cell is no longer programmed to the first programmed memory state, and apply an additional programming pulse to the first memory cell.

In another embodiment, a method is provided that includes programming a first memory cell by applying a plurality of programming pulses and a plurality of first verify pulses to the first memory cell, after applying each first verify pulse, determining if a threshold voltage Vth of the first memory cell exceeds a first verify voltage level, after determining that the threshold voltage Vth of the first memory cell exceeds the first verify voltage level, applying a single second verify pulse to the first memory cell, determining from the single second verify pulse that the threshold voltage Vth of the first memory cell does not exceed the first verify voltage level, and applying an additional programming pulse to the first memory cell to shift the threshold voltage Vth of the first memory cell above the first verify voltage level.

In another embodiment, a system is provided that includes a memory die having a memory cell and a plurality of data latches associated with the memory cell, the data latches loaded with a code representing a particular programmed memory state of the memory cell, and a controller connected to the memory die. The controller is configured to apply a plurality of programming pulses to the memory cell to program the memory cell to the particular memory state, determine that the memory cell has been programmed to the particular programmed memory state, after determining that the memory cell has been programmed to the particular programmed memory state, determine that a threshold voltage Vth of the memory cell has shifted below a verify voltage level, apply an additional programming pulse to the memory cell to shift the threshold voltage Vth of the memory cell above the verify voltage level, and maintain the code loaded into the plurality of data latches after determining that the memory cell has been programmed to the particular programmed memory state.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. An apparatus comprising:
a memory die comprising a first memory cell; and
a controller connected to the memory die, the controller configured to:
apply a plurality of programming pulses to the first memory cell;
apply a plurality of first verify pulses to the first memory cell;
determine from the first verify pulses that the first memory cell has been programmed to a first programmed memory state;
apply a single second verify pulse to the first memory cell after determining that the first memory cell has been programmed to the first programmed memory state;
determine from the single second verify pulse that the first memory cell is no longer programmed to the first programmed memory state; and
apply an additional programming pulse to the first memory cell.

2. The apparatus of claim 1, wherein the controller is configured to apply the plurality of programming pulses and the plurality of first verify pulses in a sequence of program loops.

3. The apparatus of claim 1, wherein the first memory cell is coupled to a bit line, and the controller is configured to bias the bit line to a first bias voltage while applying the plurality of programming pulses to the first memory cell, and bias the bit line to a second bias voltage greater than the first bias voltage while applying the additional programming pulse to the first memory cell.

4. The apparatus of claim 1, wherein the controller is further configured to partially inhibit the first memory cell from being programmed while applying the additional programming pulse to the first memory cell.

5. The apparatus of claim 1, wherein the controller is further configured to:
- determine in a first program loop N that the first memory cell has been programmed to the first programmed memory state;
- apply the single second verify pulse to the first memory cell in a second program loop N+i, where i≥1; and
- apply the additional programming pulse to the first memory cell in a third program loop N+i+j, j≥1.

6. The apparatus of claim 1, wherein:
- the memory die further comprises a second memory cell; and
- the controller is further configured to apply a third verify pulse to the second memory cell and then apply the single second verify pulse to the first memory cell.

7. The apparatus of claim 1, wherein:
- the memory die further comprises a second memory cell; and
- the controller is further configured to apply a program pulse to the second memory cell while applying the additional program pulse to the first memory cell.

8. The apparatus of claim 1, wherein:
- the memory die further comprises a second memory cell;
- the first memory cell is coupled to a first bit line;
- the second memory cell is coupled to a second bit line; and
- the controller is configured to:
  - bias the first bit line to a first bias voltage while applying the plurality of programming pulses to the first memory cell; and
  - bias the second bit line to the first bias voltage and bias the first bit line to a second bias voltage greater than the first bias voltage while applying the additional programming pulse to the first memory cell.

9. The apparatus of claim 1, wherein:
- the memory die further comprises a second memory cell; and
- the controller is further configured to apply the plurality of programming pulses to the first memory cell to program the first memory cell to the first programmed memory state, and apply the plurality of programming pulses to the second memory cell to program the second memory cell to a second programmed memory state different from the first programmed memory state.

10. The apparatus of claim 1, wherein:
- the apparatus further comprises a plurality of data latches associated with the first memory cell; and
- the controller is further configured to:
  - load the plurality of data latches with a code representing the first programmed memory state of the first memory cell prior to applying the plurality of programming pulses to the first memory cell; and
  - not reset the code loaded into the plurality of data latches after determining that the first memory cell has been programmed to the first programmed memory state.

11. The apparatus of claim 1, wherein:
- the apparatus further comprises a plurality of data latches associated with the first memory cell; and
- the controller is further configured to:
  - load the plurality of data latches with a code representing the first programmed memory state of the first memory cell prior to applying the plurality of programming pulses to the first memory cell; and
  - maintain the code loaded into the plurality of data latches throughout an entire programming operation of the first memory cell.

12. A method comprising:
- programming a first memory cell by applying a plurality of programming pulses and a plurality of first verify pulses to the first memory cell;
- after applying each first verify pulse, determining if a threshold voltage of the first memory cell exceeds a first verify voltage level;
- after determining that the threshold voltage of the first memory cell exceeds the first verify voltage level, applying a single second verify pulse to the first memory cell;
- determining from the single second verify pulse that the threshold voltage of the first memory cell does not exceed the first verify voltage level; and
- applying an additional programming pulse to the first memory cell to shift the threshold voltage of the first memory cell above the first verify voltage level.

13. The method of claim 12, wherein the first memory cell is coupled to a bit line, and the method further comprises biasing the bit line to a first bias voltage while applying the plurality of programming pulses to the first memory cell, and biasing the bit line to a second bias voltage greater than the first bias voltage while applying the additional programming pulse to the first memory cell.

14. The method of claim 12, further comprising applying the plurality of programming pulses and the plurality of first verify pulses in a sequence of program loops.

15. The method of claim 14, further comprising:
- determining in a first program loop N that the threshold voltage of the first memory cell is above the first verify voltage level;
- applying the single second verify pulse to the first memory cell in a second program loop N+i, where i≥1; and
- applying the additional programming pulse to the first memory cell in a third program loop N+i+j, j≥1.

16. The method of claim 12, further comprising:
- programming a second memory cell by applying the plurality of programming pulses to the second memory cell;
- applying a third verify pulse to the second memory cell to determine if a threshold voltage of the second memory cell exceeds a second verify voltage level; and
- applying the single second verify pulse to the first memory cell after applying the third verify pulse to the second memory cell.

17. The method of claim 12, further comprising applying one of the plurality of programming pulses to the second memory cell while applying the additional program pulse to the first memory cell.

18. The method of claim 12, wherein:
- the first memory cell is associated with a plurality of data latches; and
- the method further comprises:
  - loading the plurality of data latches with a code representing a first programmed memory state of the first memory cell prior to applying the plurality of programming pulses to the first memory cell; and
  - maintaining the code loaded into the plurality of data latches after determining that the threshold voltage of the first memory cell exceeds the first verify voltage level.

19. A system comprising:
- a memory die comprising a memory cell and a plurality of data latches associated with the memory cell, the data latches loaded with a code representing a particular programmed memory state of the memory cell; and a controller connected to the memory die, the controller configured to:
- apply a plurality of programming pulses to the memory cell to program the memory cell to the particular memory state;
- determine that the memory cell has been programmed to the particular programmed memory state;
- after determining that the memory cell has been programmed to the particular programmed memory state, determine that a threshold voltage of the memory cell has shifted below a verify voltage level;
- apply an additional programming pulse to the memory cell to shift the threshold voltage of the memory cell above the verify voltage level; and
- maintain the code loaded into the plurality of data latches after determining that the memory cell has been programmed to the particular programmed memory state.

20. The system of claim 19, wherein the memory cell is coupled to a bit line, and the controller is further configured to bias the bit line to a first bias voltage while applying the plurality of programming pulses to the memory cell, and bias the bit line to a second bias voltage greater than the first bias voltage while applying the additional programming pulse to the memory cell.

* * * * *